United States Patent
Grudin et al.

(10) Patent No.: US 7,703,051 B2
(45) Date of Patent: Apr. 20, 2010

(54) TRIMMING TEMPERATURE COEFFICIENTS OF ELECTRONIC COMPONENTS AND CIRCUITS

(75) Inventors: Oleg Grudin, Montréal (CA); Leslie M. Landsberger, Westmount (CA); Gennadiy Frolov, Montréal (CA); Lyudmila Grudina, Montréal (CA)

(73) Assignee: Microbridge Technologies Inc., Montreal, Quebec (CA)

( * ) Notice: Subject to any disclaimer, the term of this patent is extended or adjusted under 35 U.S.C. 154(b) by 952 days.

(21) Appl. No.: 10/549,926

(22) PCT Filed: Mar. 19, 2004

(86) PCT No.: PCT/CA2004/000397

§ 371 (c)(1),
(2), (4) Date: Jul. 10, 2006

(87) PCT Pub. No.: WO2004/097860

PCT Pub. Date: Nov. 11, 2004

(65) Prior Publication Data

US 2006/0279349 A1    Dec. 14, 2006

Related U.S. Application Data

(60) Provisional application No. 60/455,855, filed on Mar. 20, 2003.

(51) Int. Cl.
*G06F 17/50* (2006.01)

(52) U.S. Cl. ............................... 716/4; 716/5; 29/610.1

(58) Field of Classification Search ...................... 716/1, 716/4–5; 327/334; 324/537, 549, 691, 713; 29/610, 612, 620
See application file for complete search history.

(56) References Cited

U.S. PATENT DOCUMENTS

| 2002/0008302 | A1 | 1/2002 | Singh et al. | |
| 2002/0113127 | A1* | 8/2002 | Takeuchi et al. | 235/462.25 |
| 2003/0062984 | A1* | 4/2003 | Ito et al. | 338/25 |
| 2003/0101573 | A1* | 6/2003 | Nelson et al. | 29/612 |

OTHER PUBLICATIONS

Babcock, J.A.et al. *Polysilicon resistor trimming for pachaged integrated circuits* Electron Devices Meeting, 1993. Technical Digest., p. 247-250 U.S.A. 1993 (XP010118446).
Babcock ,J.A. et al. *Precision electrical trimming of very low TCR poly-sige resistors* IEEE Electron Device Letters, IEEE Inc.,vol. 21, No. 6, p. 283-285 U.S.A. 2000 (XP000951962).
Feldbaumer D.W. et al. *Theory and aplpication of polsilicon resistor trimming* Solid State Electronics, Elsevier Science Publishers, vol. 38, No. 11, p. 1861-1869 G.B. 1995 (XP004002629).

* cited by examiner

*Primary Examiner*—Vuthe Siek
(74) *Attorney, Agent, or Firm*—Ogilvy Renault LLP

(57) ABSTRACT

There is described methods and circuits for trimming a temperature coefficient of change of a parameter of at least one electrical component while maintaining a substantially constant parameter value, the method comprising applying a heating cycle to trim said parameter value away from a target parameter value and back to said target parameter value, whereby the temperature coefficient of change is modified after applying said heating cycle.

14 Claims, 18 Drawing Sheets

TRIMMING TEMPERATURE COEFFICIENTS OF ELECTRONIC COMPONENTS AND CIRCUITS

CROSS-REFERENCE TO RELATED APPLICATIONS

This application claims priority under 35USC§119(e) of U.S. provisional patent application 60/455,855 Mar. 20, 2003 and is related to PCT patent application entitled "Bi-Directional Thermal Trimming of Electrical Resistance" having international publication number WO2004/097859 and PCT patent application entitled "Trimmable Resistors Having Improved Noise Performance" having international publication number WO2004/097861, which are hereby incorporated by reference.

FIELD OF THE INVENTION

The invention relates to adjusting a temperature coefficient of an electronic circuit component, such as resistance (TCR). More specifically, it relates to a method for trimming temperature coefficients independently from a component or circuit parameter value for an electrical component made of a thermally mutable material.

BACKGROUND OF THE INVENTION

The trimming (adjustment) of resistors is a widely used procedure in the manufacture of microelectronics and electronic components, and in common design of user circuits, especially where precision calibration is desired. In principle, one trims the resistor until an observable local or global circuit parameter reaches a desired value. Resistor trimming is widespread in both manufacturing of a variety of components and instruments, and in the user community.

The design of any high-precision analog electrical circuit must entail careful consideration of temperature variation. This is especially true when the circuit involves thermally mutable materials such as polysilicon. Beyond static spatial temperature gradients, time variation in temperature is a universal phenomenon in the use of electronic circuits and systems, occurring every time an electronic system is turned on (powered up), and occurring continually as the ambient environment around the circuit changes. Analog chip and system designers devote considerable effort to ensuring robustness in the presence of temperature changes. This is because, in general, the properties of all materials exhibit some changes with temperature. A primary example is that of temperature coefficient of resistance (TCR).

In the calibration of a high precision circuit, it is advantageous to have fine-adjustment control simultaneously over both circuit component parameter values (such as resistance) and their temperature coefficients (such as TCR). Fine adjustment of resistance, while TCR changes in a less-easily-measured manner, is problematic, since the circuit is liable to lose its calibration any time the temperature varies from the temperature at which calibration was executed. This non-ideally under conditions of external temperature fluctuation would become more and more severe for higher precision of adjustment. Indeed the problem of simultaneous control of both resistance and TCR is a great source of difficulty in the analog electronics industry. Because of this, the measurement and control of TCR of resistance elements is very important for high-precision circuits. This is particularly important when one considers circuits and systems which are adjustable to high-precision. The higher the precision of adjustment of an adjustable element (or of an overall circuit or system), the smaller the temperature, variation which can significantly change the calibration of the circuit or system.

For example, consider two resistors having resistance values matched within 10 ppm. If the relative TCR (RTCR) is mismatched by as little as 1 ppm/K, then the resistance will drift by 50 ppm over a 50° C. range, overwhelming the fine adjustment of resistance. This situation is not optimal, since in the calibration of a high precision circuit, one needs fine-adjustment control simultaneously over both resistance and TCR, in order to have the needed control over one's circuit. There is clearly a need for rapid measurement and adjustment of TCR, to high precision, to accompany high-precision adjustment of resistance.

SUMMARY OF THE INVENTION

Accordingly, it is an object of the present invention to independently trim the resistance value and the TCR of a particular resistance element, both being trimmed to high precision.

It is also an object of the present invention to design and manufacture a circuit with a resistance value and TCR of a particular resistance element that will be trimmed to a high precision.

According to a first broad, aspect of the present invention, there is provided a method for adjusting a parameter of a thermally mutable material and a temperature coefficient of change of the parameter, the method comprising: selecting a target parameter value; selecting a target temperature coefficient independent from the target parameter valve and within a range of temperature coefficient values available for said target parameter value; trimming the parameter value until the parameter value is within an acceptable margin from the target parameter value; and trimming the temperature coefficient until the temperature coefficient is within an acceptable margin from the target temperature coefficient, while maintaining the parameter value within the acceptable margin from the target parameter value.

Preferably, trimming the temperature coefficient comprises applying a sequence of heat pulses to the electrical component. One heating cycle comprises a series of heat pulses that trim the parameter value away from the target parameter value and back to it within an acceptable margin. One heating cycle is used to trim the temperature coefficient by one increment. Many heating cycles may be used to trim the temperature coefficient to the target temperature coefficient.

Also preferably, the electrical component is a resistor on a thermally-isolated micro-platform. It should be understood that the resistor, or electrical component, can be embedded in or into the micro-platform.

According to a second broad aspect of the present invention, there is provided a method for providing a circuit, the method comprising: designing the circuit including at least one thermally-mutable component having a target parameter valve and a target temperature coefficient of change of the parameter value independent from the target parameter value; specifying physical parameters for the at least one component such that a trimmable range for the parameter includes the target parameter value, and a trimmable range for the temperature coefficient includes the target temperature coefficient of change; and manufacturing the circuit on a substrate wherein the component has a nominal parameter value within the trimmable range for the parameter and the component has a nominal temperature coefficient of change within the trimmable range for the temperature coefficient. Preferably, the physical parameters comprise a position of the component in the circuit and dimensions of the component.

While it is typical to trim a single component, it can be understood that the method of the present invention covers also the trimming of one or multiple components within a circuit such that the circuit reaches a target value or a desired state. For example, a pair of resistors may be trimmed to a target a relative TCR value of zero. While the target value of each resistor individually cannot be identified at a specific value at the time of design, it is known that the balanced state will fall within a given range for the parameter and the TCR of the pair of resistors. Therefore, the terms "target parameter value" and "target temperature coefficient of change of the parameter value" should be understood as being for a single component, or for one or multiple components within a larger circuit having an overall target value.

According to a third broad aspect of the invention, there is provided a circuit for adjusting a parameter of an electrical component made from a thermally mutable material and a temperature coefficient of change of said parameter, the circuit comprising: a thermally isolated micro-platform on a substrate for the electrical component; heating circuitry having a decision-making module for applying a sequence of heat pulses; measuring circuitry for measuring the parameter and the temperature coefficient of the electrical component.

Preferably, the decision making module is for determining an amplitude of a heat pulse, a duration of the heat pulse, and a time interval before a succeeding heat pulse. The heating circuitry generates a heating cycle for trimming the temperature coefficient and the heating cycle comprises a sequence of pulses to trim the parameter in a first direction and a sequence of pulses to trim the parameter in an opposite direction. The decision-making module determines an amplitude of a first pulse of the sequence of pulses to determine a direction and an amount of trim of the temperature coefficient.

It should be understood that the heating circuitry, the decision-making module, and the measuring circuitry can be on or off the chip which houses the electrical component. For example, the decision-making module can be a computer, microprocessor, a logic state machine, automated electrical test equipment such as typically found in high volume integrated circuit production, or any other device that can adequately determine the parameters of a succeeding pulse in accordance with the present invention.

According to a fourth broad aspect of the present invention, there is provided a method for trimming a temperature coefficient of change of a parameter of an electrical component while maintaining a substantially constant parameter value, the method comprising applying a heating cycle to trim the parameter value away from a target parameter value and back to the target parameter value, whereby the temperature coefficient of change is modified after applying the heating cycle.

According to a fifth broad aspect of the present invention, there is provided a circuit comprising at least one electrical component made of a thermally mutable material defined by an upper limit and a lower limit of a parameter, and having a temperature coefficient of change of said parameter, characterized in that said parameter is set to a predetermined target parameter value and said temperature coefficient of change is set to a predetermined target temperature coefficient of change value independent of said target parameter value.

Preferably, the electrical component is a resistor made of polysilicon, the parameter is resistance, and the temperature coefficient of change is temperature coefficient of resistance.

In this patent application, the term "thermally-mutable material" is intended to mean a material that behaves like a polycrystalline semiconductor material having electrical and/or other material properties that can be reversibly changed within a certain range by restructuring of the "grains" making up the material and/or grain boundaries, and/or spatial distribution of dopants within the grains, and/or grain boundaries. Once a change to the property is affected, it remains essentially stable for the purposes of subsequent operation. Such restructuring can be achieved by thermal cycling and/or by physical simulation such as application of pressure, etc. In the present state of the art, polycrystalline silicon (polysilicon) and polycrystalline silicon-germanium are known to be thermally-mutable materials. While the making of resistors from polysilicon is the most common application, it is known to make a resonator from polysilicon, in which the resonant frequency of the resonator is trimmable due to changes in its mechanical properties.

BRIEF DESCRIPTION OF THE DRAWINGS

These and other features, aspects and advantages of the present invention will become better understood with regard to the following description and accompanying drawings wherein.

DETAILED DESCRIPTION OF THE PREFERRED EMBODIMENT

While the prior art demonstrates that the TCR changes when one trims the resistance, it does not show how to trim the TCR while maintaining a constant resistance value.

This approach to trim the TCR of thermally-mutable materials such as polysilicon is based on certain experimentally observed phenomena, involving a hysteresis-like phenomenon, outlined below.

It should be noted that for the purpose of this disclosure, trimming is to be understood as increasing or decreasing the room-temperature value of an electrical component such as a resistor. It should also be noted that thermally-isolated is meant to describe an element that is isolated from other elements such that the heat flux (proportional to temperature differential) generated between the element and other elements, is generally low. Electrically-isolated is meant to describe an element that is isolated from other elements such that the resistance between this element and other elements is very high (e.g. hundreds of k-ohms). The term signal is meant to describe any data or control signal, whether it be an electric current, a light pulse, or any equivalent. A heating cycle should be understood as a sequence of pulses used to trim a parameter in a first direction and a sequence of pulses to trim the parameter in an opposite direction, i.e. away from a starting point and back towards the starting point. There are at least two pulses in a heating cycle, each pulse being of the same or different amplitude, and each pulse being of the same or different duration.

A polysilicon resistor trimmed from its as-fabricated resistance value $R_{Init}$, down to a certain resistance, $R_{target}$, is known to experience a shift in TCR (known from U.S. Pat. No. 6,306,718, US2002008302). This affect is diagrammed in FIG. 1.

Figure 1:
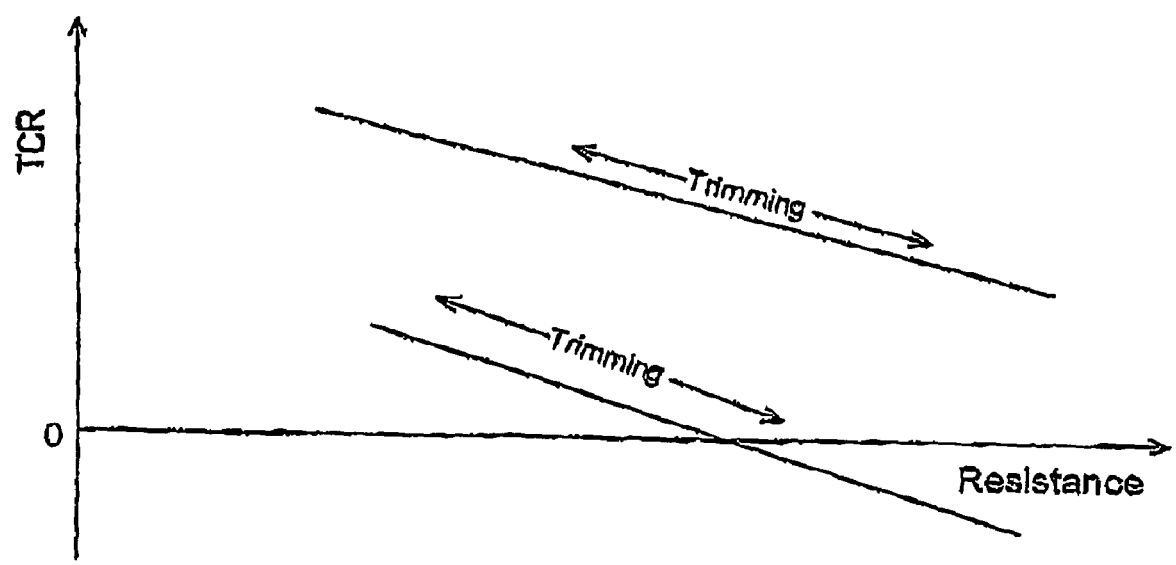
FIG. 1: Schematically describes the dependence of TCR on thermal trimming of resistance according to the prior art.

After such trimming, the resistor can be trimmed further "down", and then "recovered" back to $R_{target}$; or it can be "recovered" up to a certain intermediate resistance value higher then $R_{target}$, and then trimmed back "down" to $R_{target}$, in each case departing from $R_{target}$, and subsequently returning to the same $R_{target}$. Let us call such a cycle a "TCR-change cycle", or a heating cycle. The effect of such a cycle is to adjust the TCR of the resistance by a small amount (such as less than 100 ppm/K), above or below one of the typical curves in FIG. 1. In other words, one can maintain the resistance value constant while independently changing the TCR in a small range around the TCR value that would normally correspond to a particular resistance value on a curve such as shown in FIG. 1.

The thermal cycling associated with the adjustment of resistance (either up or down) requires a series of heating pulses having sensitively different amplitudes. The tendency is that higher heating pulses result in trimming down. Pulses with lower amplitude result in resistance recovery or trimming down, depending on the recent thermal history.

It was experimentally found that a TCR-change cycle containing first at least one heating pulse having rather high amplitude (to cause trimming down) and then a plurality of recovery pulses having lower (not necessarily constant) amplitude, results in a decrease of TCR. Fastest recovery is obtained by applying a sequence of pulses where each pulse is equal to or lower than the previous. If the next analogous TCR-change cycle contains another "first" heating pulse having higher amplitude than the previous one, the TCR will again decrease.

It was also experimentally found that, if, within a TCR-change cycle, the "first" heating pulse or pulses (which may give either a moderate decrease or increase in resistance), has amplitude substantially lower than the amplitude of the "first" pulse(s) in a recent TCR-change cycle which decreased TCR, then the TCR can be increased instead of decreased (Note that the determination of whether TCR was increased or decreased must be done after the resistance is restored to $R_{target}$).

Pulses slightly above (close to) the threshold for resistance trimming can increase the resistance value very slightly and gradually with only negligible changes in TCR.

Decreasing the TCR is found to be much less controllable than increasing the TCR, since increasing TCR requires a "first" pulse in the cycle having high pulse amplitude. It is also experimentally found that said TCR-change cycles having "first" heating pulses having low or moderate amplitudes result in gentle and gradual rise of TCR while reduction of TCR happens abruptly.

If it is desired to decrease TCR, one needs to first apply high-amplitude heating pulses, and then gentle resistance recovery pulses. If after the first TCR-change cycle, it is not decreased as needed, in the next cycle, the "first" high-amplitude pulse or pulses need to be at the same or higher amplitude as the "first" pulse or pulses of the previous decrease cycle. This is done until the TCR is below $TCR_{target}$. After that, one can apply much gentler TCR-change cycles (including lower amplitude first pulses) to gradually increase the TCR to its target.

There may be a "first"-pulse amplitude threshold for TCR decrease vs. increase, but this threshold varies with thermal history and position in the available trimmable range.

The phenomena of TCR trimming are most effectively described in terms of pulse amplitudes which cause resistance changes, as opposed to in terms of the resistance changes themselves. In other words, the effect on TCR of a pulse is most related to its amplitude, as opposed to the resistance change which it causes.

Figure 2:
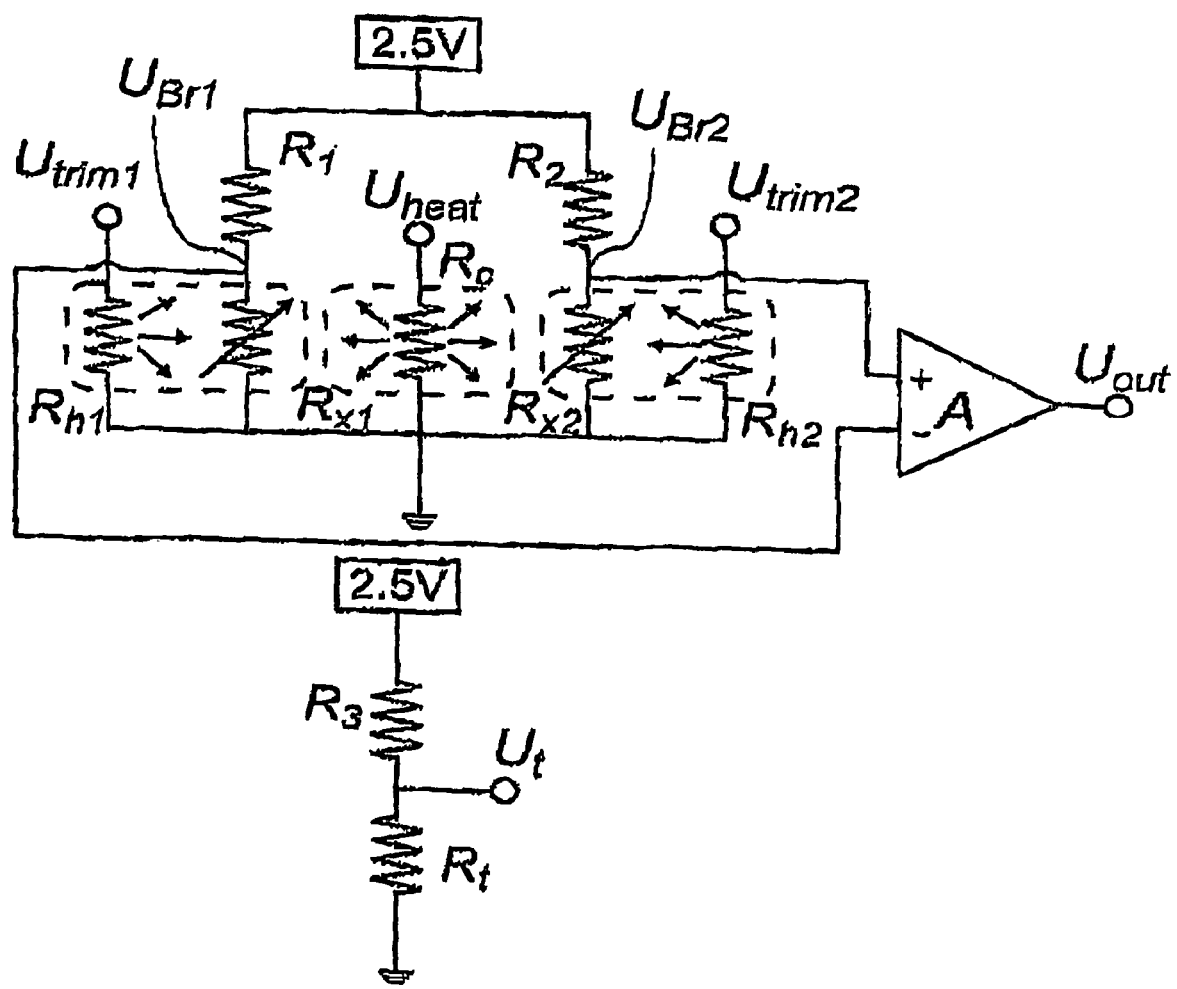
FIG. 2: Shows electronic circuitry with two trimmed polysilicon resistors and adjustable relative TCR.

The circuit shown in FIG. 2 provides a suitable embodiment with which to explain the principles of the present invention. It contains two electrically-trimmable polysilicon resistors $R_{x1}$ and $R_{x2}$. Each of these resistors is placed on separate thermally-isolated microstructures, together with auxiliary heaters $R_{h1}$ and $R_{h2}$. The functional resistors are connected in a Wheatstone bridge with two metal resistors $R_1$ and $R_2$, and powered by a constant voltage of 2.5V. The differential voltage at the two midpoints of the bridge, designated $U_{Br1}$ and $U_{Br2}$ in FIG. 2, is amplified by instrumentation amplifier A and processed by external data acquisition board (not shown). The structure also contains polysilicon resistor $R_c$ placed on a separate thermally isolated microstructure between resistors $R_{x1}$ and $R_{x2}$ such that its heating caused by applied voltage $U_{heat}$ results. In symmetric (equal) temperature rise in the functional resistors $R_{x1}$ and $R_{x2}$. In case the temperature of the chip needs to be measured, a polysilicon resistor $R_1$ having substantial TCR (e.g. TCR~900 ppm/K) may be placed nearby on the chip (not on the microstructure). It may be connected in series with another (e.g. metal) resistor $R_3$, the divider being powered by 2.5V. The voltage $U_1$ thus may be processed to calculate the chip temperature.

Electro-Thermal Trimming of Resistance

Electro-thermal trimming of resistance can be used to individually trim a single resistor in a simple voltage divider circuit (such as $R_1$ or $R_2$ in FIG. 8), or such as $R_{x1}$ or $R_{x2}$, in simple voltage divider sub-circuits within the bridge depicted in FIG. 2, or to trim one or both of the resistors $R_{x1}$, $R_{x2}$ with the purpose of balancing the bridge in FIG. 2. For example, electro-thermal trimming allows to reduce resistance value of polysilicon resistor (or made from other polycrystalline material such as Si—Ge) from its "as-manufactured" value $R_{inl}$ to a certain value $R_{min}\sim(0.3.0.5)*R_{inl}$. It is known that after trimming "down", increase of resistance ("recovery") is also possible, to an approximate value $R_{max}$, which is typically less than $R_{inl}$. Trimming of the resistance $R_{actual}$ can be repeated many times between $R_{max}$ and $R_{min}$, ($R_{min} < R_{actual} < R_{max}$). Usually recovery is initiated by heating pulses lower than previously applied heating pulses which caused trimming "down." The same heating pulse may have different effects of trimming "up" or "down" depending on amplitude and effect of previously applied heating pulses. Therefore the result of an applied trimming pulse is sensitive to thermal "pre-history". The lower limiting value, $R_{min}$, is due to the fact that its further reduction requires higher heating pulses that may cause catastrophic damage to the resistor. Increase of the resistance higher than $R_{max}$ on the other hand, requires much longer trimming time, even hours (Babcock et al (J. Babcock, P. Francis, R, Bashir, A. Kabir, D. Shroder, M. Lee, T. Dhayagude, W. Yindeepol, S. Prasad, A. Kalnitskly. M. Thomas, H. Haggag, K. Egan, A. Bergemont, P. Jansen, Precision Electrical Trimming of very Low TCR Poly-SiGe Resistors IEEE Electron. Dev. Letters, Vol. 21 (2000), 6, pp. 283-285), Canadian Microelectronic Corporation Report #IC95-08 September 1995). For very long trimming time, $R_{max}$ can be raised higher than $R_{inl}$ (Canadian Microelectronic Corporation Report #IC95-08 September 1995, and O. Grudin, R. Marinescu, L. M. Landsberger, D. Cheeke, M. Kahrizi. "CMOS Compatible High-Temperature Micro-Heater: Microstructure Release and Testing," Canadian Journal of Elec. And Comp. Engineering, 2000, Vol. 25; No. 1, pp. 29-34). Practical trimming processes taking a few seconds are possible in the range $R_{min} < R_{actual} < R_{max} < R_{inl}$.

An adaptive algorithm for trimming a parameter value, such as a resistance, involves applying a sequence of pulses, interleaved with measurements of resistance, by which each pulse can learn from the previous sequence of pulses. The important principles of the adaptation may be peculiar to thermally-mutable materials such as polysilicon and polycrystalline SiGe.

The basic principles are:

In order to attain recovery which is fast over a wide resistance range, the pulse amplitudes are adaptively decreased, from one set of pulses to the next, in order to maintain a high rate of recovery. This adaptive decrease can be done until the threshold for resistance adjustment is reached.

In order to maximize the recovery range and speed to attain the greatest recovery range, the sequence of recovery pulses begins with a high-amplitude pulse, whose initial effect may be in some cases a large trim "down", and whose consequences is to allow more steps of decrease in pulse amplitude as described in (a) above. This allows recovery to higher resistance values. Note that the first high-amplitude pulse may be even higher then the last "down" pulse.

In order to maximize recovery speed for a given recovery range, the amplitude of the first high-amplitude pulse in (b) above, is to be chosen appropriately. For fast recovery over a moderate range, an intermediate amplitude of the first pulse in a recovery sequence is preferable.

In order to maximize the speed of recovery over an intermediate recovery range, the pulse amplitudes are decreased as soon as the recovery speed drops below a certain fraction of the initial speed at a given pulse amplitude.

In order to attain very precise recovery, pulses having amplitude just above the threshold for resistance change can be used, to obtain very low recovery rate, also in order to obtain very fine adjustment.

In order to accelerate trimming "down", especially when the desired magnitude of adjustment ("distance") is a significant fraction of the resistance value, the pulse amplitude is adaptively increased, depending an the decrement in resistance obtained by the previous pulse, and on the remaining "distance" to the target resistance.

Also in order to accelerate trimming "down", when high precision is not required, or when the remaining "distance" to the target is large, the time interval between pulses, during which the resistance is measured, can be shortened, (for example to 25 ms instead of 50 ms which would be needed for a high-precision accurate measurement).

In order to attain high-precision trimming, if the target resistance, $R_{target}$, is passed (during recovery), several cycles (trim down—recovery up) can be performed, where the pulse parameters from the previous cycle are "inherited" by the next pulse and processed such that the probability of passing the target is lower in the next cycle.

Figure 11:
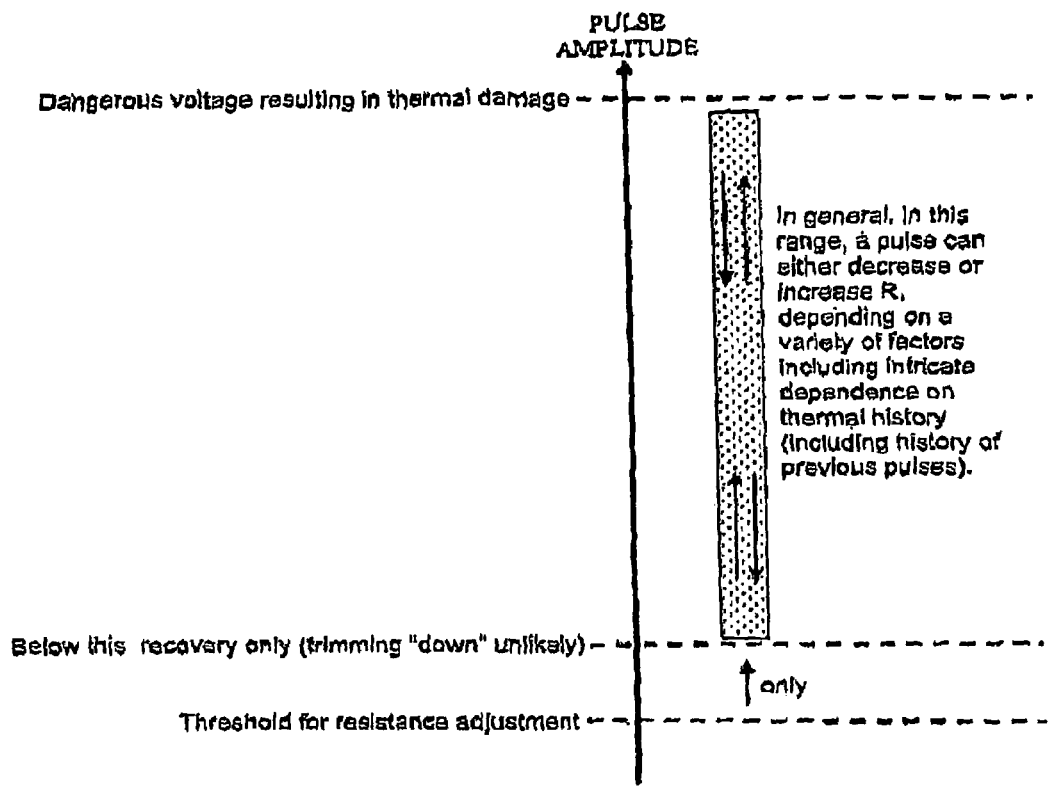
FIG. 11: Shows generally the trimming behavior vs. pulse amplitude.

FIG. 11 describes qualitatively the trimming behavior as a function of pulse amplitude above the threshold for resistance change, in particular, it indicates that the direction of trimming ("down" vs. recovery), resulting from a given pulse amplitude, can vary depending on a variety of factors, notably the thermal history of pulses applied, as well as microstructure layout, thermal isolation, resistivity, resistive material dimensions and grain parameters, heater layout and resistance. It also indicates the presence of a small range of pulse amplitudes, just above the threshold, which gives only recovery in most cases.

Indeed, all of the resistors featured in the specific trimming examples herein were made from polysilion from a standard CMOS integrated circuit manufacturing process. The polysilicon sheet resistance was about 40 ohms/square. The polysilicon resistors being trimmed, and their associated heater-resistors, were embedded in micro-platforms made from typical CMOS surface films, including silicon dioxide and silicon nitride. The resistor line widths were approximately 1 to 4 microns, and the micro-platforms had lateral dimensions of several tens to hundreds of microns, separated from each other by 10-30 microns. The thermal isolation was on the order of 30-50 K/mW.

Figure 12:
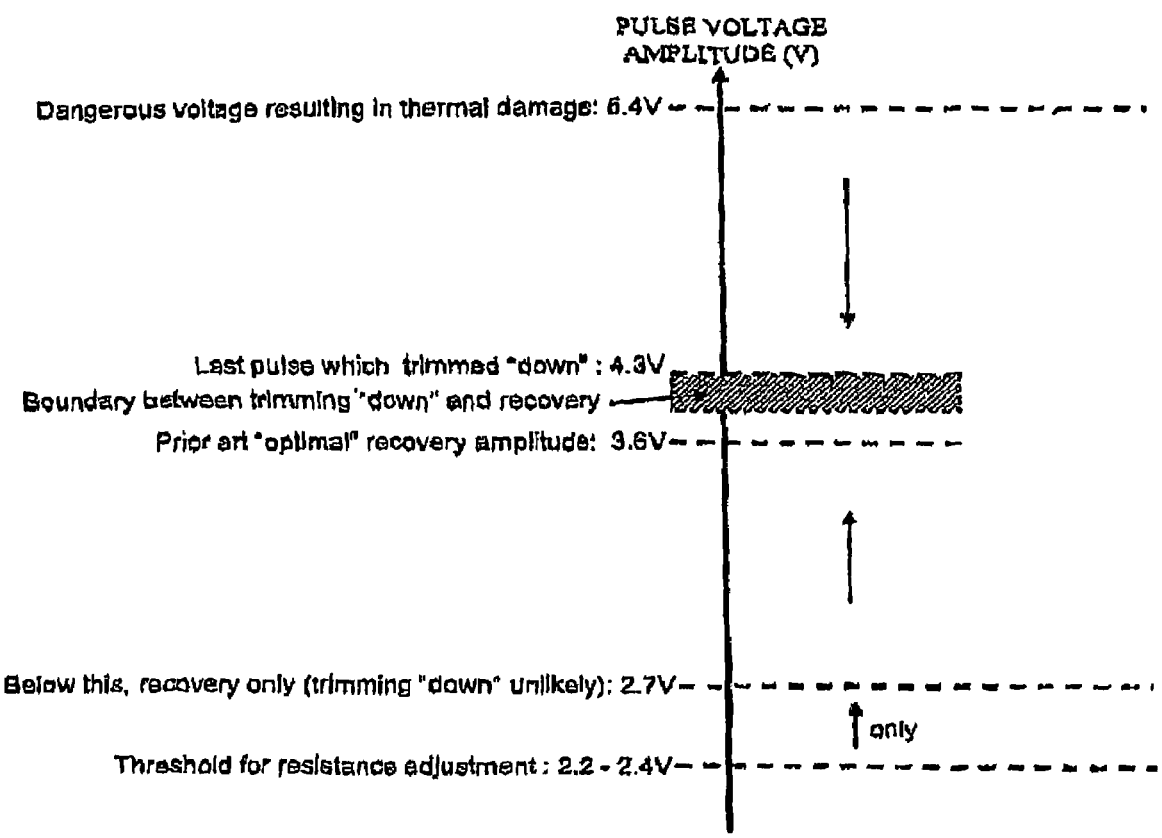
FIG. 12: Shows a quantitative example of the direction of trimming vs. pulse amplitude.

FIG. 12 gives a quantitative example of the trimming behavior, for a particular resistor, having as manufactured value 7200 Ohms, trimmed down to about 5500 Ohms, and having been trimmed bi-directionally several tens of times in the range of 5200 Ohms to 6500 Ohms, which had recently been subjected to a recent sequence of "down" pulses, ending at V=4.3V. In this case, the direction of trimming is strongly influenced by the amplitude of the last "down" pulse, (even if there are several other recovery pulses in between). There is a rough threshold above which short exposure at a given amplitude, or a sequence of pulses having increasing amplitude, causes decrease in the resistance.

Another trend observed in relation to the trimming of polysilicon is that if one continues to increase the amplitude of the applied pulses, eventually (usually after one or two such increasing pulses), one will achieve trimming "down". Also, if after trimming "down", one applies a sequence of pulses having decreasing amplitude, then eventually (usually after one or two such decreasing pulses), one will achieve "recovery". However, the behavior of the resistance as a function of exposure at a constant amplitude is not straightforward. Trimming "down" will be achieved for short enough accumulated time, but after longer exposure at that constant amplitude, the resistance will eventually rise, and can rise above its value at the beginning of the constant-amplitude exposure (but this could take hours).

In general, an important characteristic of electro-thermal resistor trimming is its dependence on thermal history. The same heating pulse may result in either increase or decrease of resistance, depending on the amplitude and effect of previous pulses. Thus, a "rigid" algorithm with fixed matching parameters may not be effective and accurate because the parameters of the heating pulses should essentially depend on a combination of conditions such as the difference between the as-manufactured resistance $R_{init}$ and the target resistance $R_{target}$, and the sign and magnitude of the difference between the present resistance $R_{actual}$ and the target resistance $R_{target}$, the positioning of $R_{actual}$ and $R_{target}$ with respect to $R_{init}$, and history of thermal cycles (which may not be known). Therefore a trimming algorithm with an adaptive character is preferable, where the heating pulse parameters (amplitude, pulse width and interval between pulses) are decided or adjusted based on analysis of previous heating pulses, resulting resistance changes, trimming rate, "distance" to target and required precision of next trimming shot.

Adaptive Decrease of Recovery Pulse Amplitude: Improvement of the recovery stage is based on the following experimentally-discovered phenomena. A polysilicon (having sheet resistance of 40 Ohms/square) resistor, called the "functional" resistor, with as-manufactured resistance of 7200 Ohms is located on a suspended microstructure. An auxiliary "heater" resistor with resistance of 960 Ohms is placed on the same microstructure close to the functional resistor, and serves to heat the micro-structure and trim the functional resistor. The functional resistor is connected in series with a constant metal resistor having resistance 21.9 kOhms, in a voltage divider configuraton. A constant voltage of 2.5V is applied to this voltage divider, and the voltage drop across the functional resistor is measured using an automated (computer-controlled) data acquisition board (including an 8-channel 12-bit ADC and 4-channel 12-bit DAC). Then the resistance of functional resistor is calculated. Self-heating of the functional resistor caused by the measurement current (<100 μA), does not exceed 1.5° C. The data acquisition board is used also to apply voltage pulses to the heater (electrically isolated from functional resistor). The temperature rise in the described structure can exceed 600-700° C., causing a brightly glowing orange color, visible by microscope.

Figure 13:
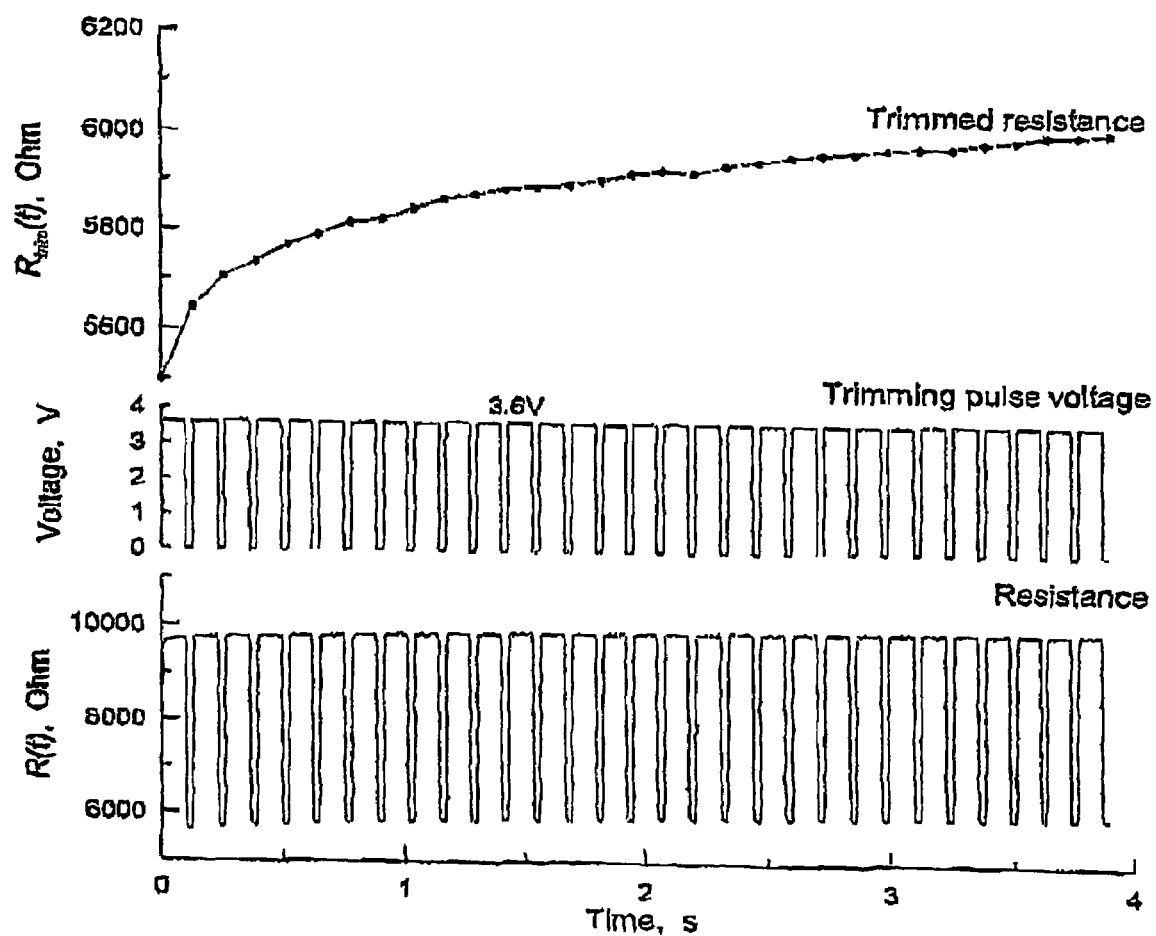
FIG. 13: Shows resistance recovery at a constant recovery voltage of 3.6V (near optimal, according to the prior art, about 85% of the last "down" pulse)
Figure 14:
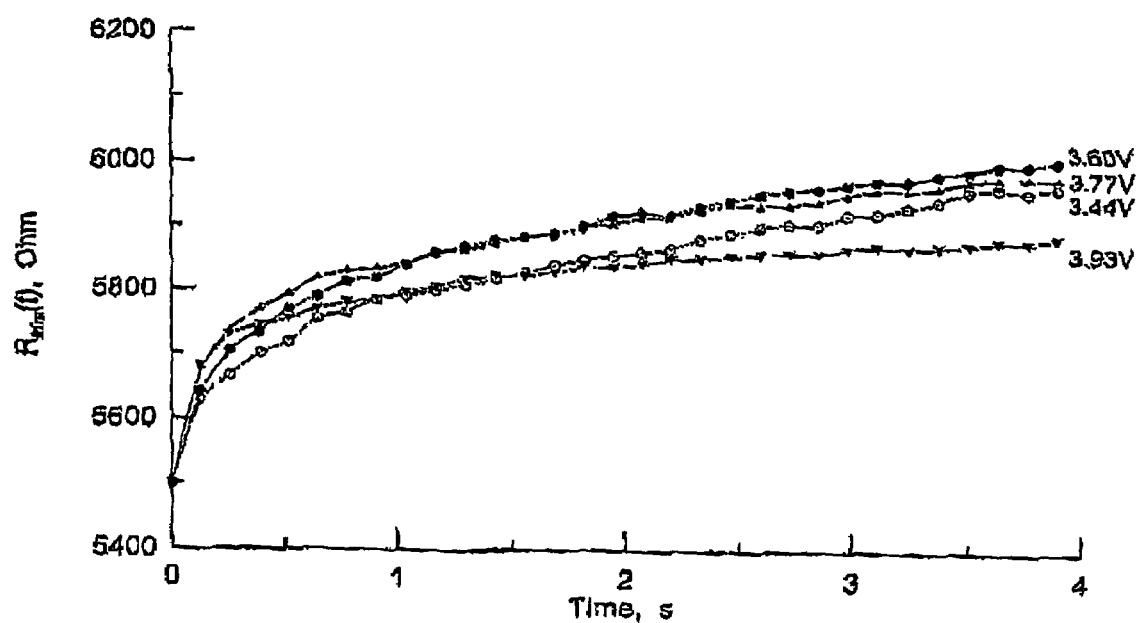
FIG. 14: Shows resistance recovery of the same resistor as in FIG. 13, at constant recovery voltages of 3.44V, 3.6V, 3.77V, 3.93V, demonstrating that 3.6V is near optimal, in accord with the prior art.

The functional resistor is trimmed down, using pulses from the DAC, to 5500 Ohms. Then the recovery stage is begun. FIG. 13 shows the resistance recovery of the functional polysilicon resistor when a constant voltage of 3.6V is applied to the heater. The accompanying high temperature results in instantaneous resistance rise up to approximately 10000 Ohms, shown at the bottom of the figure. Periodically, every 130 ms, the heating voltage is turned off for an interval of 30 ms, in order to allow the structure to cool down. The so-trimmed resistance of the functional resistor, $R_{trim}$, is then measured at room temperature, at the end of the 30 ms interval. FIG. 13 shows the application of 30 pulses, each having amplitude 3.6V, the entire sequence taking approximately 4 seconds. At the end of this sequence, the resistance is seen to have increased by 500 Ohms, up to 6000 Ohms.

Figure 15:
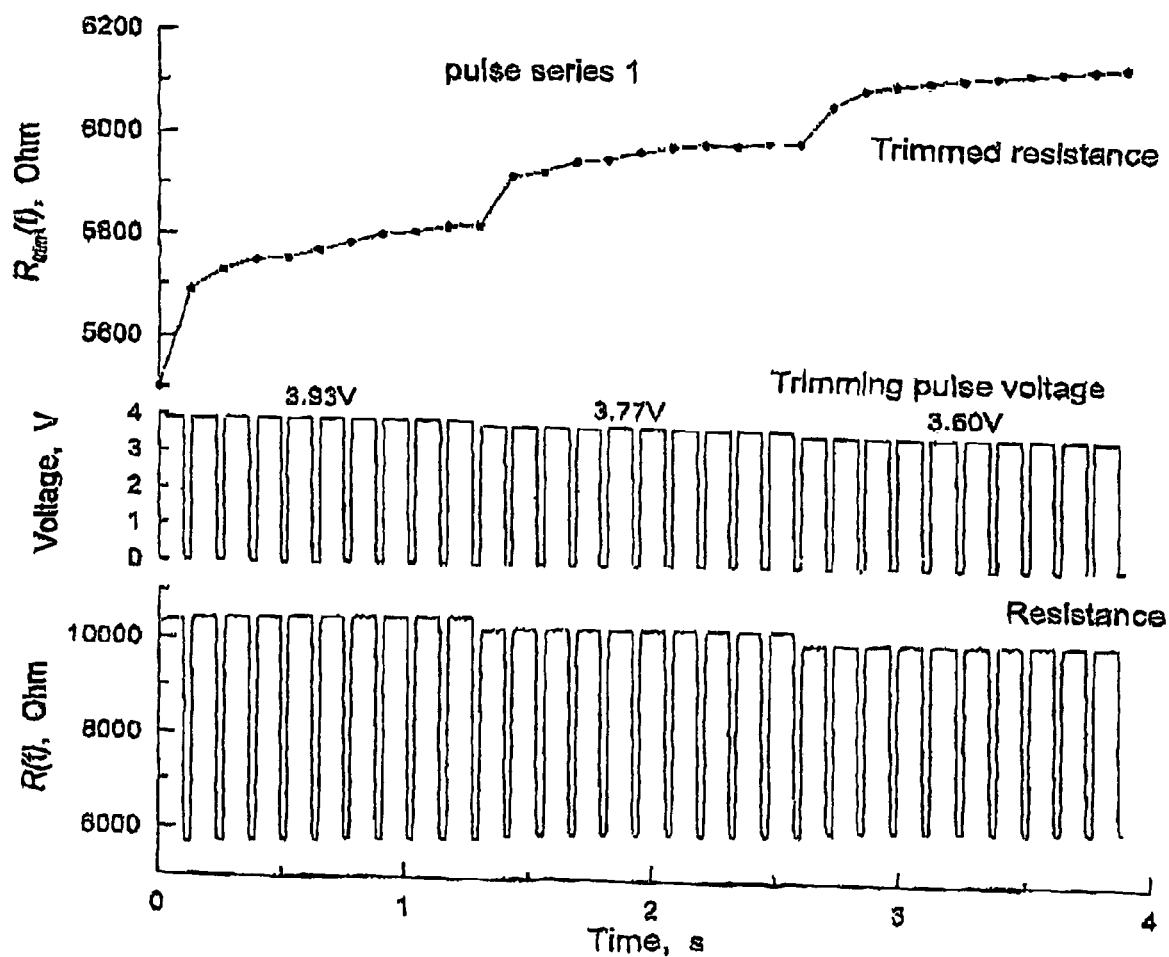
FIG. 15: Shows the result of pulse-series-1, an example of the invented decreasing sequence of recovery pulses, with acceleration of recovery at each decrement of pulse amplitude.
Figure 16:
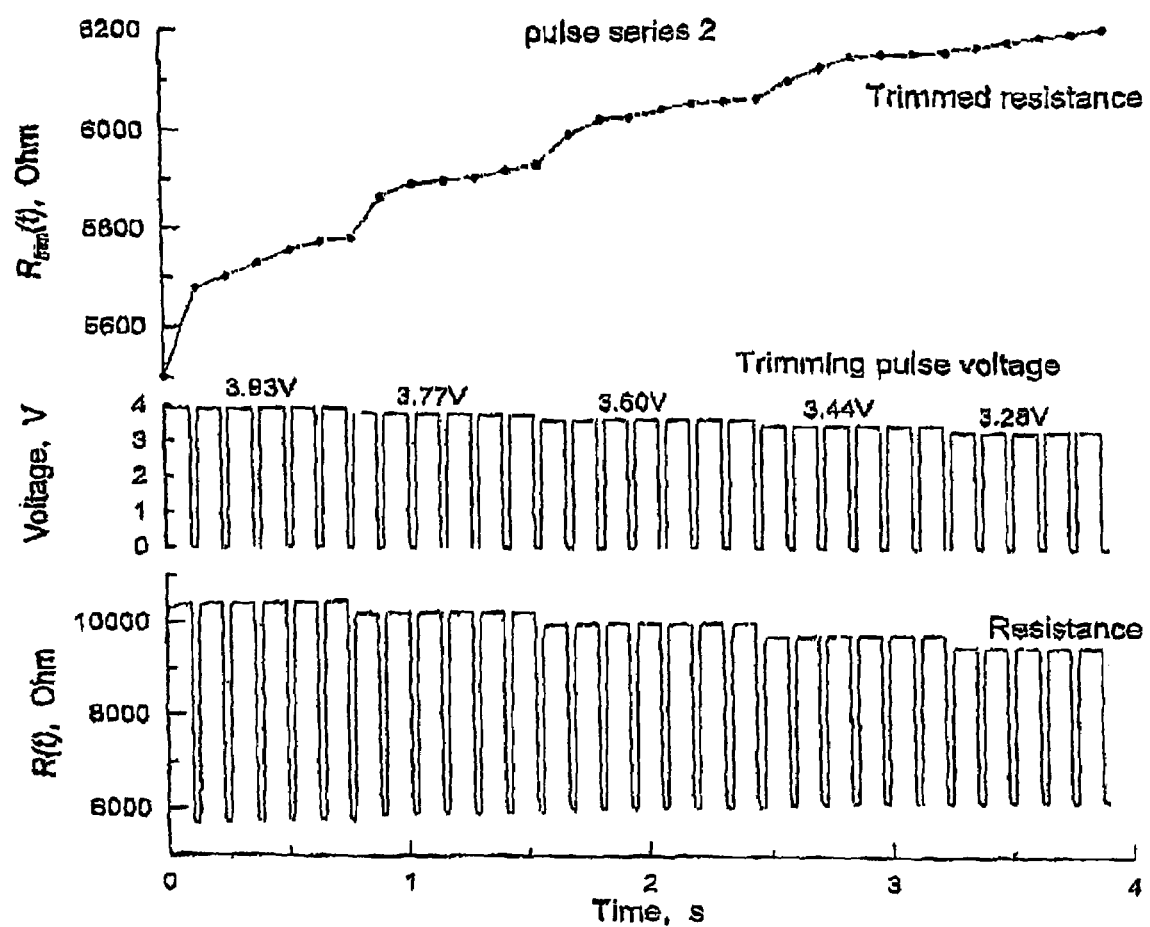
FIG. 16: Shows the result of pulse-series-2, another example of the invented decreasing sequence of recovery pulses.

Two examples are shown in FIGS. 15 and 16, where sequences of pulses having voltages 3.93V, 3.77V, and 3.60V (FIG. 15), and 3.93V, 3.77V, 3.60V, 3.44V, and 3.28V (FIG. 16), were used. Significantly greater recoveries of 640 Ohms and 700 Ohms were reached in the same 4-second time period.

Figure 17:
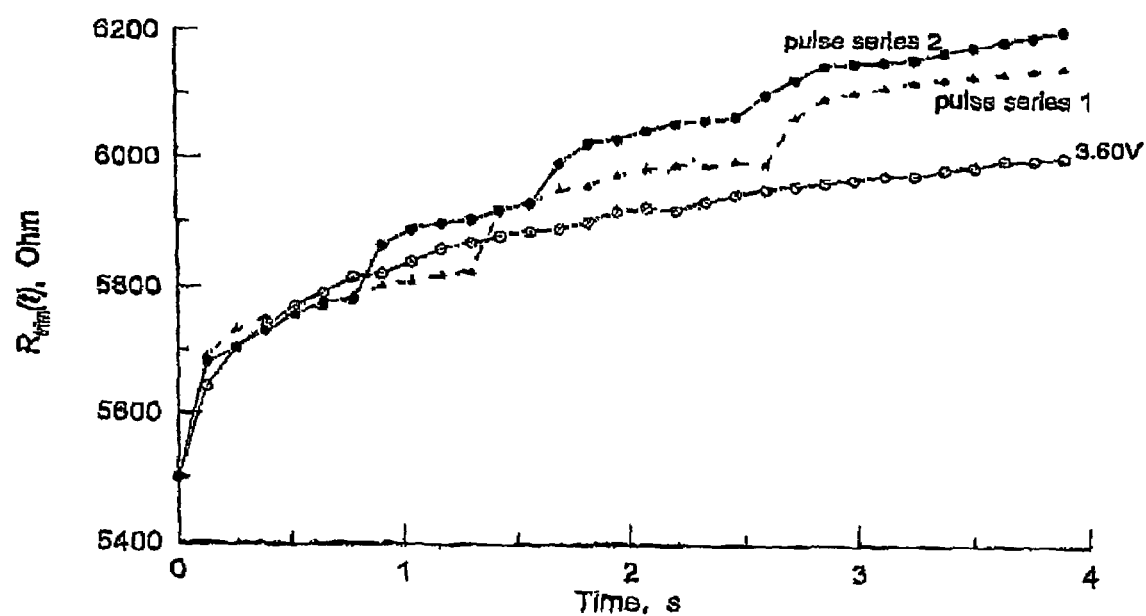
FIG. 17: Compares the speed and range of recovery of the sequences using adaptive decrements, with the speed and range of recovery of the sequence analogous to the prior art.

The above-described experiments, summarized for comparison in FIG. 17, demonstrate two advantages to the adaptive decreasing of heating-pulse amplitude: a) a greater recovery range can be attained; and b) an equal recovery range an be reached faster, (for example, a 500 Ohm recovery can be reached in less than 2 s using the adaptive pulse sequence.)

Figure 18:
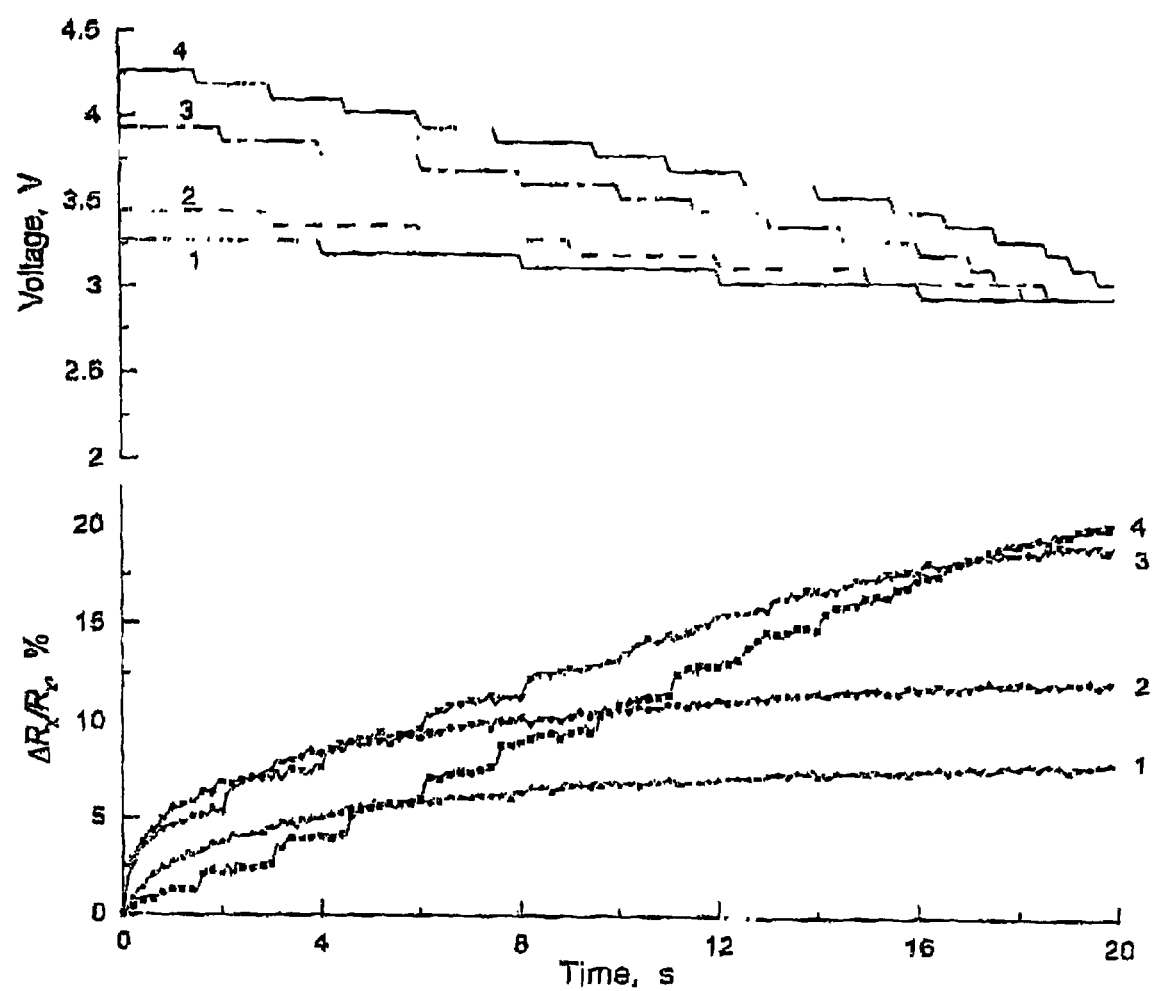
FIG. 18: Compares recoveries achieved from four 20-second recovery pulse sequences, each beginning at different pulse amplitudes, and ending at approximately the same pulse amplitude.

FIG. 18 compares "deeper" recoveries achieved from longer (20-second) recovery pulse sequences. Four 20-second recovery pulse sequences were selected, each beginning at different pulse amplitudes, and ending at approximately the same pulse amplitude. As was done in previous figures, heating was interrupted for 30 ms every 100 ms to record the room-temperature resistance, $R_{x1}$. For visual clarity, these interruptions are not shown in the figure. Thus, note that for these experimental 20-second sequences, the effective trimming time is 20 s*0.7=14 s (70 ms heating and 30 ms cooling). In practice, the adjustment algorithm could reduce these interruptions to enhance efficiency.)

High-Precision Recovery: For the purposes of effective, accurate and precise trimming, it is no only important to recover quickly—it is often important to recover intentionally very slowly. Otherwise approaching target resistance with accuracy of better than 100 ppm (0.01%) becomes problematic. Two techniques are presented, which can be used separately or in combination.

Figure 10:
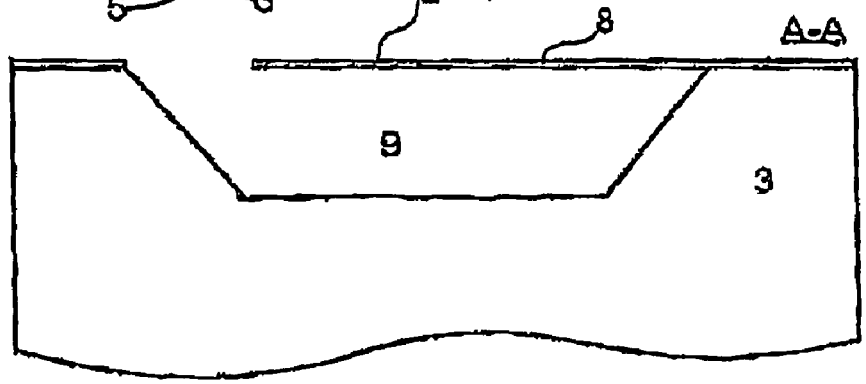
FIG. 10: is a cross-sectional view of the structure shown in FIG. 9.

Use shorter recovery pulses, at a given recovery pulse amplitude;

Use lower recovery pulse amplitudes, just above the threshold for resistance change. Heating pulses with much lower amplitudes than mentioned in the examples above, can be used. FIG. 10 shows resistance recovery when heating pulses of 2.62V, 2.79V and 2.95V are applied (with otherwise the same experimental conditions as described above). The noise in resistance measurements is caused by the limited resolution of the 12-bit ADC, and limits the accurate recording of fine changes in resistance obtained at 2.62V (and at lower voltages). An important experimental result is that the increase in heating pulse amplitude compared to the previous pulse gives an increase of the resistance (not a decrease as found by several authors in the prior art, who reported using heating pulses with increasing amplitude to trim resistance downward). The average resistance increases obtained at 2.62V were in the range of a few 100 ppm per pulse.

Usage of such low recovery rate, combined with short heating pulses, is useful and convenient because short heating pulses with easily-controlled duration of 5-30 ms, can give resistance increments as low as a few ppm or less.

Adaptive Regulation of Pulse Width and Interval Between Heating Pulses: In general, the requirements for high precision, say 0.01% or lower deviation from the target resistance, can be reached when the recovery rate is properly controlled. It is preferable to have high recovery rate when the "distance" from the target is substantial. On the other hand, recovery rate reduction is important in close vicinity to the target. Regulation of pulse width is an important tool to control the magnitude of resistance increment due to a recovery pulse, and improve trimming accuracy with reduction of total trimming time.

In general, the above trimming operations, including FIGS. 13 to 18, are outlined to show elementary examples of how certain trimming pulses parameters may be varied in order to obtain a desired result. The parameter adjusted may be a simple resistance, or a component within a larger system. The Wheatstone bridge circuit with amplifier depicted in FIG. 2 is such an example of a larger system, where the goal is to tune the amplified output by trimming the resistors $R_{x2}$ and $R_{x2}$, in order to balance the bridge.

Measuring TCR or RTCR

The measurement of temperature coefficients of circuit elements positioned on an integrated circuit involves heating a small volume or area of the integrated circuit, and measuring the generally-temperature-sensitive parameter of a circuit component while the component is at an elevated temperature.

Zero-Crossing Determination or Uncalibrated Measurement of Absolute Temperature Coefficient of a Single Component: Thus a preferred embodiment of this invention consists of a single resistive element positioned in or on a thermally-isolated microstructure, accompanied by a resistive heater, positioned in or on the same microstructure, or a closely adjacent microstructure placed above the same micromachined cavity. This basic configuration allows measurement of temperature coefficient(s) on an arbitrary or uncalibrated scale relative to zero, without requiring accurate knowledge of the actual temperature in the heated element. The heater heats the targeted element, and observation of the trend in the electrical parameter of the targeted element allows an uncalibrated measurement, and determination of whether that electrical parameter is positive, zero, or negative. If only such an uncalibrated measurement or a zero-crossing determination is required, then the heater may be on the some or a separate microstructure, and it does not need to be temperature-calibrated.

Measurement of Absolute Temperature Coefficient of a Single Component: If, on the other hand a measurement of the absolute temperature coefficient is required, then the heater must be calibrated such that it generates a known temperature at the functional component. Of course, the so-calibrated heater must remain stable and accurate, otherwise there must be a stable and calibrated temperature sensing device in the vicinity of the functional component. If, for example, the functional component is subjected to high temperature during operation (or, for example during thermal trimming), then this may make it necessary for the TCR-measurement heater to be placed on a separate microstructure such that it is not subjected to the highest temperatures (and thus remains more stable and calibrated). The initial calibration of the device used to sense the temperature may be done by several methods, including using an oven. After such calibration, (if it is stable), it may be used many times to measure the temperature coefficient of a targeted functional element.

Figure 7:
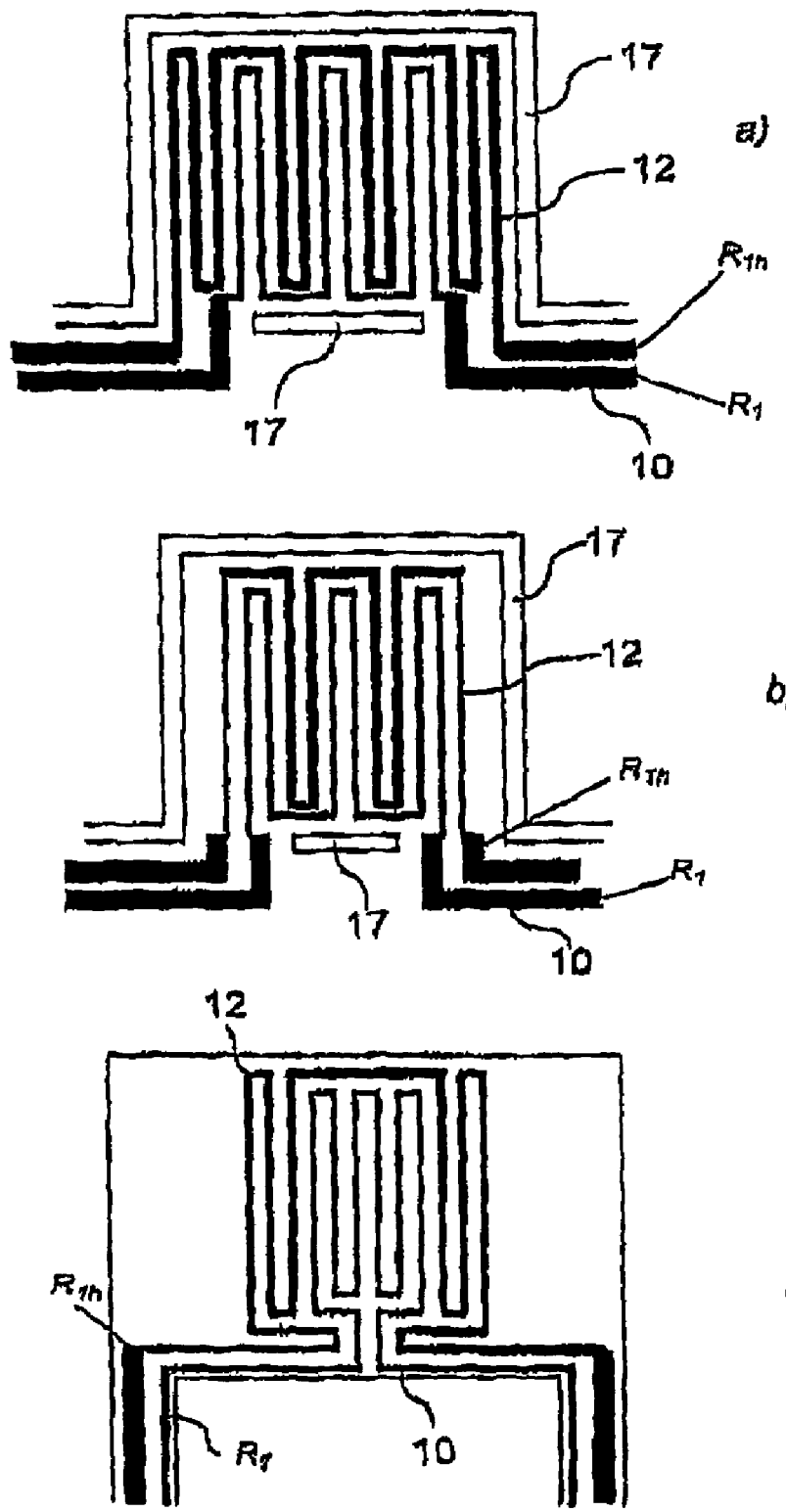
FIG. 7: shows three examples of layouts intended to dissipate more power at the edges of the heat-targeted region.

Uniform Temperature in Heated Component: Since the goal in measurement of temperature coefficient(s) is to imitate the effect of changes in the ambient temperature, effective determination or measurement of temperature coefficient(s) requires that the heated element be as much as possible at the same temperature. Therefore, measures should be taken to obtain a relatively constant temperature distribution in the heated element. For this purpose, we use layouts such as are shown in FIG. 7. Thus, for accurate control of heating in the functional resistor, it is important for the entire functional resistive element being heated to be maintained at the same (and controllable) temperature. Thus the spatial T profile, T(x) in the heat-targeted region, should be constant. However, since the heat-targeted element, even in steady state, is intended to be at a higher T than its surroundings, the boundaries of the heat-targeted region will tend to be at a temperature lower than the T at the center. In order to compensate for this, FIGS. 7a, 7b, and 7c show examples of layouts intended to dissipate more power at the edges of the heat-targeted region. More power can be dissipated at the edges of the heat-targeted region by increasing the resistive path around the perimeter, and/or increasing the resistivity of the elements at the perimeter. It is preferable to have a major portion of the functional resistor having flat temperature distribution. Therefore, a power dissipation geometry for the heating element can comprise supplying more heat around the edges of the functional resistor in order to counteract a faster heat dissipation in the edges and resulting temperature gradients across the thermally-isolated micro-platform.

Figure 8:
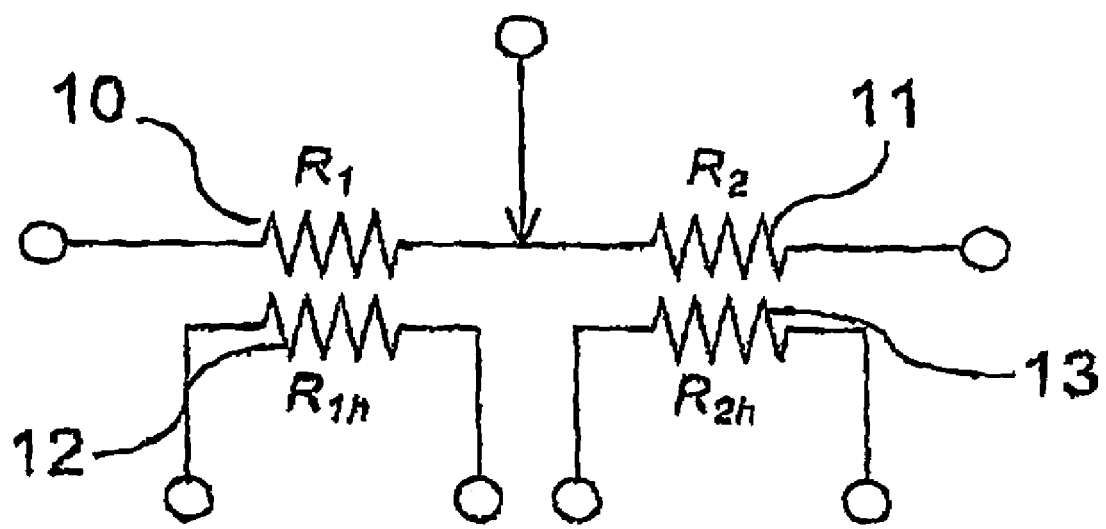
FIG. 8: shows the electrical schematic of two functional resistors, and two heating resistors electrically isolated from the functional resistors.
Figure 9:
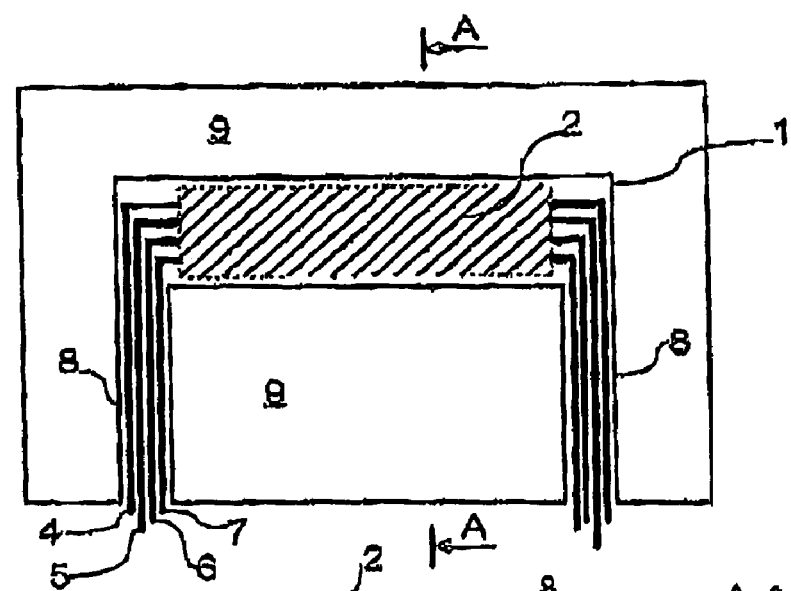
FIG. 9: is a top view schematic of a possible configuration of the micro-platform with four resistors, suspended over a cavity.

Zero-Crossing Determination or Uncalibrated Measurement of Relative Temperature Coefficient of a Plurality of Components Sharing an Operating Environment: For many applications, a combination of two or more resistors are used in a circuit. Some important cases include voltage dividers, R-R dividers, R-2R dividers, Wheatstone bridges, sensor input conditioning circuits, resistor networks. For example, the equivalent circuit of a simple voltage divider is shown in FIG. 8. These devices may be made to be very stable, even if the resistors have non-zero TCRs, as long as their TCRs are well-matched. For example, if the difference of the TCRs of the resistors is 0.001%/° K (10 ppm/K), then a temperature imbalance of 10° K will give a resistance mismatch of 100 ppm. In such cases, it can be important to measure the relative temperature coefficients, or at least to determine whether the relative temperature coefficients of two components is positive, negative, or zero. In such a case when the goal is to match the relative temperature coefficients, it is often not important that the measurement of the deviation from zero be calibrated. One possible configuration of this case is shown schematically in FIGS. 9-10. In this embodiment, two resistors are placed on the same thermally-isolated microstructure, and one or more heaters are additionally placed on the same thermally-isolated microstructure, in order to heat them.

Electro-Thermal Trimming of TCR or RTCR

Figure 3:
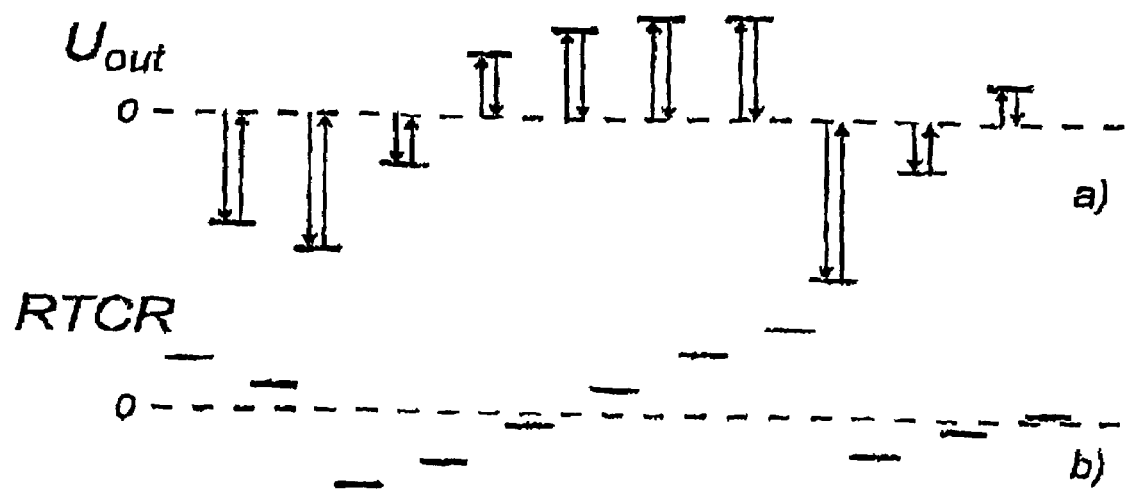
FIG. 3 is a graph showing a change in RTCR that accompanies a trimming and recovery cycle of a resistance.
Figure 4:
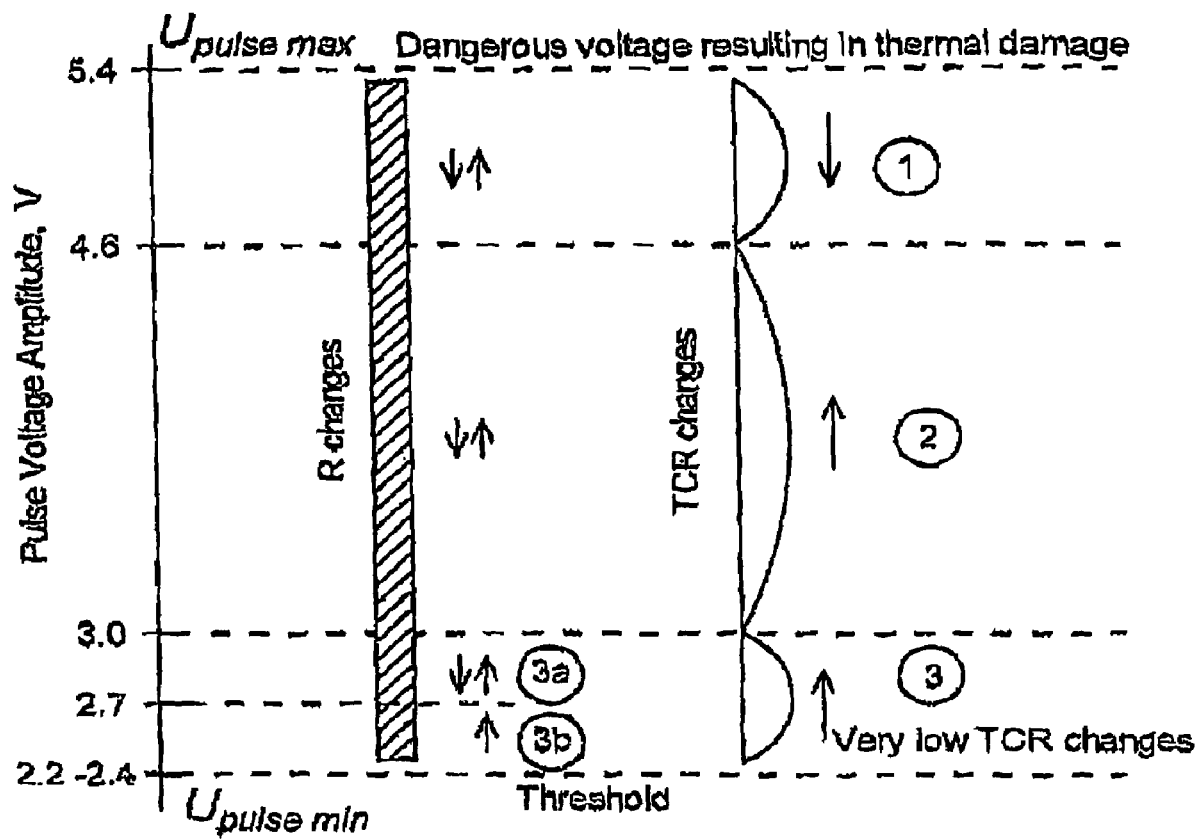
FIG. 4: Shows schematically an example of the effect of heating pulse amplitude on an example of a microstructure, in the context of a TCR-change cycle.

Without limiting the generality of the foregoing, the TCR trimming phenomena may be conceptually described in FIGS. 3 and 4.

Beginning from an unbalanced bridge differential voltage in FIG. 2, resistor $R_{x1}$ is trimmed until the bridge is balanced (until amplifier output $U_{out}$ is close to zero. This represents the trimming of resistor $R_{x1}$ to its target resistance $R_{target}$ (see below).

FIG. 3 schematically depicts an example sequence of operations to adjust TCR. Each time the resistance is trimmed away from $R_{target}$, and returned to $R_{target}$, (seen in the excursions away from $U_{out}=0$ in FIG. 3a), the TCR of $R_{x1}$ changes (seen in the changes in the RTCR of the bridge in FIG. 3b). The direction and magnitude of the change in TCR relates in a non-trivial manner, to the direction and magnitude of the initial change away from $R_{target}$ (represented by the leftmost arrow up or down at each resistance deviation). FIG. 3b shows the corresponding TCR shifts after resistance adjustment pulse sequences (deviation from $R_{target}$ by higher amplitudes "first" pulses and resistance-restoration back to $R_{target}$ by lower-amplitude pulses). Note that higher amplitude heating pulses result in more substantial resistance reduction. In general, the procedure to change TCR while maintaining a given resistance value, involves TCR-change cycles, or heating cycles, each causing deviation of resistance away from its given resistance value ($R_{target}$), and then causing restoration of the resistance back to $R_{target}$.

FIG. 4 summarizes very schematically an example of the effect of heating pulse amplitude on an example of a microstructure with a particular variation of polysilicon, and an auxiliary resistive heater of 960 Ohms, and a given $R_{target} \approx 0.8*R_{init}$. Note that quantitative experimental data such as these can differ depending on polysilicon variation, or microstructure layout, or $R_{target}$ deviation from $R_{init}$. For the purposes of resistance and TCR trimming, the heating pulse voltage must be higher than approximately $U_{pulse-min}$=2.4V (since lower voltages do not initiate resistance change), and must be lower than approximately $U_{pulse-max}$=5.4V (since extreme heating can cause damage to the heating resistor). (Note also that $R_{min}$ and $R_{max}$ can vary from resistor to resistor, depending on a variety of conditions). If the pulse amplitude of the "first" heating pulse (or pulses) in a TCR-change cycle, is higher than 2.7V and lower than 5.4V, resistance can be first reduced down from the target value of $R_{target} \approx 0.8*R_{init}$ and then restored back. This action is designated by the pair of arrows (down, then up). If the pulse voltage is less than approximately 2.7V, only an increase of resistance from its value of $R_{target} \approx 0.8*R_{init}$ is possible. On the right side of FIG. 4 are shown the corresponding behaviours of TCR, as a function of the voltage of the "first" pulse in a TCR-change cycle. (Thus this figure describes the behaviour of TCR in the context of a TCR-change cycle, where the vertical axis represents the amplitude of the "first" pulse in the TCR-change cycle). The thresholds defined in the figures at 5.4V, 4.6V. 3.0V, 2.7V, and 2.2-2.4V, are amplitudes of pulses, which translate into temperature thresholds, which affect the TCR of the resistance differently, depending on the region of the graph (see descriptions of the regions below). The threshold defined by 4.6V is on approximate temperature coefficient change reversal threshold because the direction of trimming of the TCR changes when that threshold is crossed. Note that the thresholds described above may be changed as a function of previously-applied pulses, and resistance and TCR trimming history in general.

The voltage range can be conditionally divided into several regions of TCR behavior:

Region 1. TCR-change cycles having "first" heating pulse (or pulses) with amplitude in this range, followed by "resistance-restoration" pulses, give a decrease of TCR. The higher the amplitude of the "first" pulse (or pulses) the more significant will be the reduction of TCR.

Region 2. TCR-change cycles having "first" heating pulse (or pulses) with amplitude in this range, applied AFTER a TCR-change cycle which began with a "first" pulse from Region 1, followed by "resistance-restoration" pulses, gives increase of TCR. Over most of this Region 2, the lower the amplitude of this "first" pulse (or pulses), the lower will be the increase of TCR (except near the boundary to Region 1).

Region 3. Very low increase in TCR occurs while the resistance can be either increased or decreased from the value of $R_{target} \approx 0.8*R_{init}$ (region 3a), or only increased, by very low (just-above-threshold) heating pulse (region 3b). The lower the amplitude of the "first" pulse (or pulses) in this region, the lower will be the increase of TCR.

Given that one has the ability to make a calibrated or uncalibrated measurement of (or infer, from other circuit information), the resistance and TCR of a given physical resistance element (passive resistance element), to enough precision for the manipulations described below, it is possible to trim the TCR of polysilicon resistors, for a given resistance value (the given resistance being maintained at its initial value, to a given precision).

The technique of TCR adjustment involves the following steps:

(a) Initial trimming operation from initial resistance value (as-manufactured or other initial value), to target resistance value, $R_{target}$. This $R_{target}$ must be within a range limited by maximum and minimum effective trimming pulse amplitudes, which will in practice be between the trimming threshold below and dangerous voltages above (see FIG. 4). This initial adjustment of resistance is done using pulsed-trimming techniques as described above, to desired precision δR (e.g., within δR=20 ppm of $R_{target}$, or within δR=200 ppm of $R_{target}$).

(b) Recording of last resistance trim "down" pulse amplitude.

(c) Measurement and recording of $R_{actual}$ with precision sufficient to determine whether it is within δR of $R_{target}$.

(d) Measurement and recording of $TCR_{actual}$ to sufficient precision δTCR (e.g. within δTCR=1 ppm/K).

(e) Decision of desired direction of TCR-adjustment and specification of target TCR value ($TCR_{target}$). This depends on characteristics of the poly known from the manufacturing process end initial measurements.

(f) Intentional adjustment of resistance away from $R_{target}$, such that $R_{actual}$ is increased or decreased: The amount trimmed away from R-target is decided according to the principles described above.

(g) Intentional trimming of resistance back to R-target, in the opposite direction from that which resulted from step (f) above.

(h) Measurement of new $TCR_{actual}$. Depending on direction and extent of trimming in step (f), the measured $TCR_{actual}$ will be increased or decreased. Also, the extent of TCR trimming will depend on the extent of resistance trimming in step (f).

(i) Iterate steps (e-h), in an adaptive manner until $TCR_{actual}$ is equal to target TCR-value within desired precision δTCR.

Note that pulses just above the threshold for resistance-trimming tend to change the TCR negligibly (less than δTCR), and therefore, this case typically doesn't require a step (g) to restore resistance—one would usually only use this case to fine-tune resistance, after TCR was already within δTCR of the desired TCR value.

In the later steps of iteration, use full precision δR, (looser precision being preferred in initial steps because they take shorter time). In step (g) R is measured. If, at this point, it is anticipated that there remain more cycles in the procedure, this R trimming can be done to a somewhat looser precision $δR_{intermediate}$, in order to save time. Resistance trimming with full precision (taking more time) need only be done if one is increasing the TCR and close to the target, say within $2*δR_{intermediate}$ below $R_{target}$.

Considerations on resistance trimming accuracy after each TCR-trimming cycle, it has been disclosed in prior art that change in trimmed resistance is accompanied by change in TCR (see FIG. 1.). Therefore, inaccurate resistance restoration after each TCR-trimming cycle may give certain error in actual TCR measurement. In our case, TCR increases by approximately 400 ppm/K when resistance is decreased by 25%. Hence 10 ppm in resistance trimming gives approximately $1.6 \cdot 10^{-2}$ ppm/K shift in measured TCR. If the required accuracy in trimming TCR is say, 0.1 ppm/K, an inaccuracy in R-trimming of 60 ppm is acceptable at this stage. On the other hand, less rigorous requirements on R-trimming accuracy would simplify resistance restoration, which could then be done faster. At the final stage of R end TCR adjustment, after TCR has been adjusted to its' target value with required precision, fine tuning of resistance with required precision (say, 10 ppm) can be done (region 3a and 3b in FIG. 4).

Figure 5:
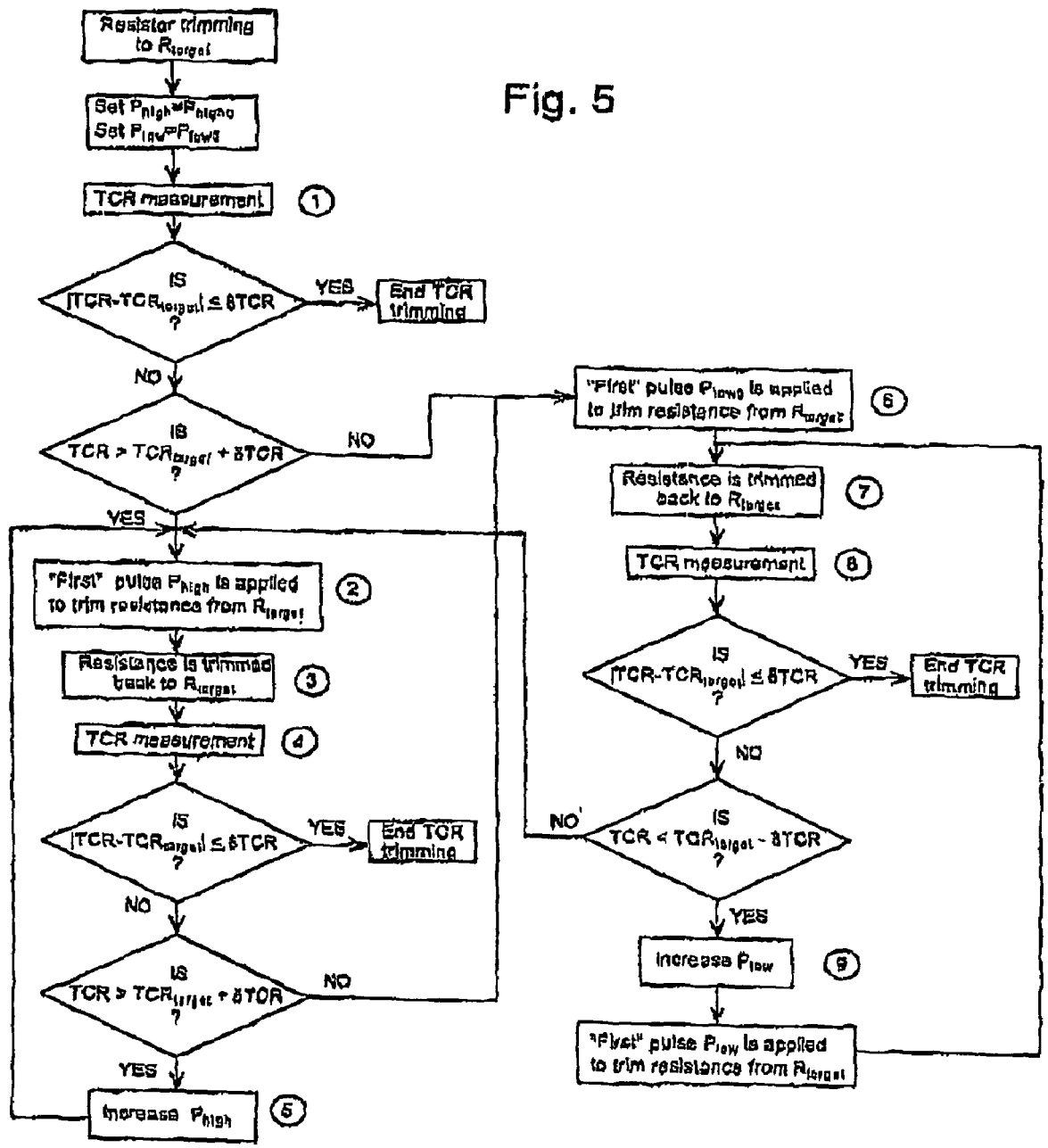
FIG. 5: Shows a flowchart of the TCR adjustment algorithm.

In accordance with the above description, the method of electro-thermal trimming of TCR includes the following steps, diagrammed in FIG. 5. The procedure begins by trimming the resistance to a certain target value $R_{target}$ ($R_{min}$<$R_{target}$<$R_{max}$). Initial "first" pulse amplitudes $P_{low0}$ and $P_{high0}$ are set to be experimentally determined values which depend on the physical properties of the thermally-mutable material and layout parameters (influencing the thermal isolation and resistance of the heater). For example, $P_{low0}$≈1.05*$U_{pulse-min}$ and $P_{high0}$≈0.8*$U_{pulse-max}$, respectively.

1) After trimming of the resistance to the certain target value, the TCR is measured. If TCR differs from its target value $TCR_{target}$ by less than δTCR, where δTCR is an acceptable precision, then the trimming process is finished. If TCR must be reduced (TCR>$TCR_{target}$+δTCR), go to step 2. If TCR must be increased (TCR<$TCR_{target}$−δTCR), go to step 6.
2) Heating pulse $P_{high}$ is applied, resulting in decrease of the resistance $R_{actual}$ (trimming "down"). Initially $P_{high}$ is set to $P_{high0}$, to be incremented each time step 5 is executed.
3) Resistance is trimmed back to its target value $R_{target}$.
4) TCR is measured. If TCR differs from its target value $TCR_{target}$ by less than δTCR, the trimming process is finished. If further TCR reduction is needed (TCR<$TCR_{target}$+δTCR), go to step 5. If TCR must be increased (TCR<$TCR_{target}$−δTCR), go to step 6.
5) The "first" heating pulse $P_{higher}$ is incremented, and the procedure loops back to step 2, to apply a pulse higher than the previous. Steps 2, 3, 4 and 5 are repeated in a loop until TCR differs from its target value $TCR_{target}$ by less than δTCR, or until the actual TCR goes below $TCR_{target}$.
6) To increase TCR, a low "first" heating pulse $P_{low}$ is applied. The effect of this pulse may be to increase or decrease resistance. At the beginning of any TCR-change cycles whose goal it is to increase TCR, the pulse amplitude may begin at $P_{low0}$, or may begin at a higher value of $P_{low}$, for example if it is known from experience with a certain batch of devices that an optimal rate of TCR change can be obtained at such a higher value of $P_{low}$. Also, the "first" pulse width may be varied in order to modulate the rate of TCR change in this phase.
7) Resistance is trimmed back to its target value $R_{target}$.
8) TCR is measured. If TCR differs from its target valve $TCR_{target}$ by less than δTCR, then the trimming process is finished. If further TCR increase is needed (TCR<$TCR_{target}$−δTCR), go to step 9. If TCR must be reduced (TCR>$TCR_{target}$+δTCR), go to step 2 (where the last known $P_{high}$ pulse will be applied.).
9) The "first" heating pulse $P_{low}$, is incremented higher than used in the immediately previous increasing cycles, and then the next $P_{low}$ is applied. Steps 7, 8 and 9 are repeated in a loop until TCR differs from its target value $TCR_{target}$ by less than δTCR, or until the actual TCR goes above $TCR_{target}$.

It should be noted that the speed and efficiency of the procedure may depend on judicious choice of the increments in $P_{high}$ and $P_{low}$, at steps 5 and 9, respectively. In step 5, if $P_{high}$ is incremented too little, then it will take a longer time (more loops of steps 2, 3, 4), before reaching step 6. If $P_{high}$ is incremented too much, then there is a greater risk of jumping too far past the TCR target, and a long sequence of recovery pulses will be required (more loops of steps 7, 8, 9). In step 9, if $P_{low}$ is incremented too little, then it will take a longer time (more loops of steps 7, 8), before reaching the target. If $P_{low}$ is incremented too much, then there is a greater risk of overshooting the target, and going back to execute more loops of steps 2, 3, 4. The choices of the magnitudes of these increments should be made in conjunction with experimentation with the thermally-mutable material.

In the case where the TCR is near to zero, end where the goal of adjustment is to reduce the TCR to zero in a small-enough range around zero, accurate knowledge of the temperature reached during TCR measurements would not be necessary. In this case, many different TCR-measurement-heater geometries and techniques would be effective.

The above-described techniques may be applied in applications where the relative TCR of two or more resistance elements is important. In these cases, one does not necessarily need to measure the temperature very accurately, but one does need to know that both (or all) of the resistance elements in question are, to the extent possible, at the same temperature. This may be effectively accomplished by using a heater geometry centrally positioned between two symmetric functional resistors. Other symmetric heater layouts are also available.

An example is where one wants the RTCR of a voltage divider to be as close to zero as possible, (or as close as possible to an appropriate non-zero value, such as might be desired, to compensate temperature-induced variations in other circuit components). Another example concerns the use of thermo-resistors in sensors. For example, in a thermo-anemometer-based pressure or flow sensor, one desires the functional resistors to have quite high individual TCR (for maximum sensitivity of the sensor), simultaneously with excellent matching of the TCR's of the same functional resistors. In this case, there is usually already a central heater (part of the function of the thermo-anemometer), which can be used here for the additional purpose of measuring the TCR by heating the sensing resistors symmetrically.

Figure 19:
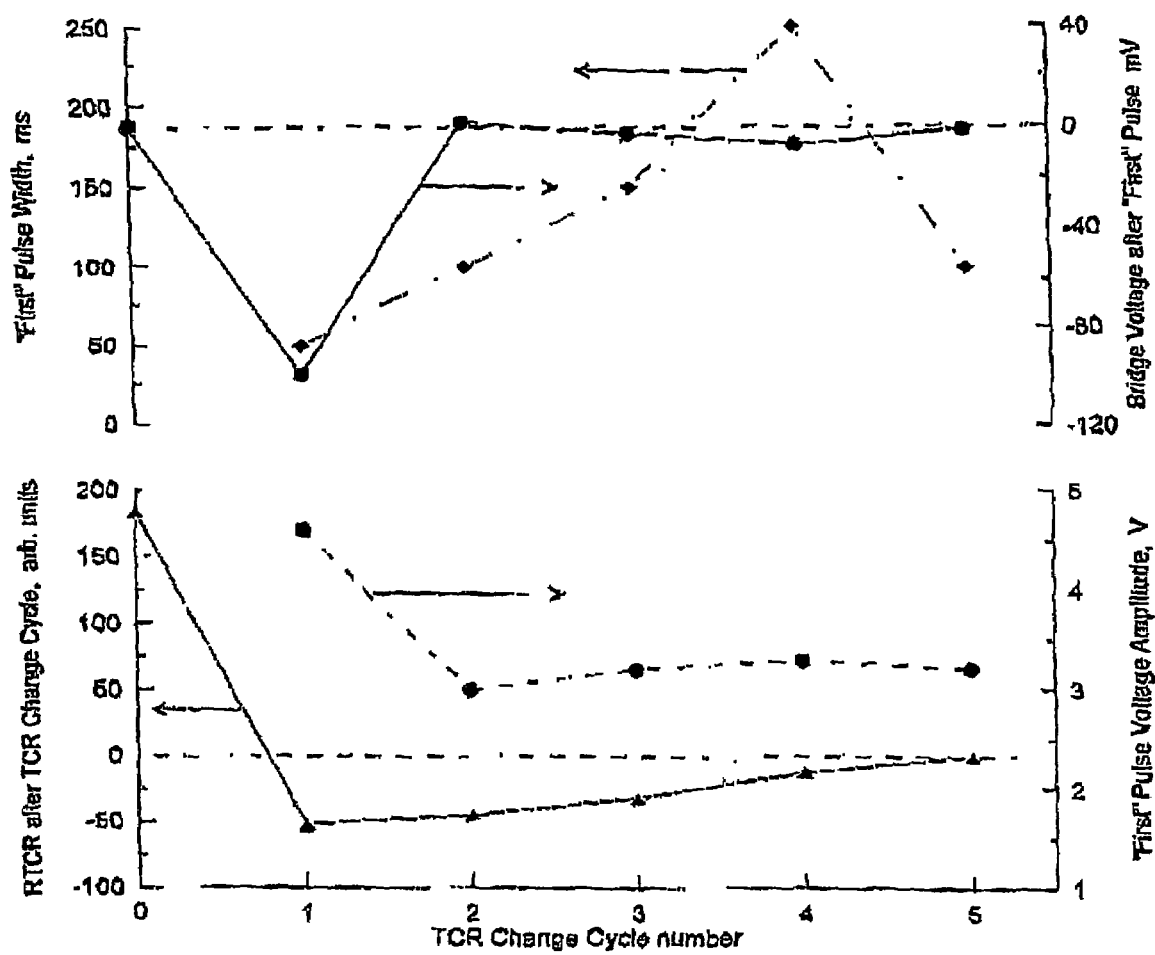
FIG. 19: Shows graphs of experimental data regarding several TCR-change cycles; trimming the RTCR of two resistors to very high precision.

FIG. 19 is a graph showing the effect of "first" heat pulse on the TCR of a resistor (seen in RTCR of a bridge circuit shown in FIG. 2). After balancing of the bridge to zero, with approximately +/−10 ppm of accuracy, a central heater $R_c$ was used to heat resistors $R_{x1}$ and $R_{x2}$ up to approximately 40+ C. above room temperature, in order to measure RTCR. Before the beginning of TCR-change cycles, the RTCR was found to be 183 arbitrary units, where 10 arbitrary units corresponds to 3 ppm/K within better than 50% of 3 ppm/K. Since the initial RTCR was positive, a TCR-change cycle involving $P_{high}$ was applied in TCR-change cycle #1. The resistance deviation (seen in the upper part of FIG. 19), due to the "first" pulse of this cycle, was such that the bridge became unbalanced to −100 mV. Following the procedure, the resistance was then restored such that the bridge was balanced, and the new TCR was measured, and found to have changed substantially—from +183 to −52 arbitrary units. Since this was below the target RTCR of zero, the next TCR-change cycle (#2) used a "first" pulse $P_{low}$, in order to raise the TCR (RTCR). The $P_{low}$ was chosen to be above $P_{low0}$ in this case, based an experience with this particular set of devices. The effect of that "first" pulse was an imbalance of the bridge by a small amount in the positive direction, to +3 mV. After subsequent restoration of the bridge balance, the effect on TCR was a small increase, from −52 to −45 arbitrary units. The remainder of the TCR-change cycles #3, #4, and #5 were applied in a similar manner, with varying pulse widths (adaptively varied as a function of "distance" to the target) and $P_{low}$ "first" pulse values, each time raising the TCR, until RTCR substantially better than 1 ppm/K was obtained after finally rebalancing the bridge at the end of TCR-change cycle #5. Note that the behaviour of resistance (upper plot) is not intuitive with respect to the behaviour shown in the other curves.

The manipulations represented in FIG. 19 would take less than approximately 20 seconds in an automated mode. Note that the TCR-change cycle #1 took the most time, approximately 6 seconds, due to the long resistance rise ("recovery")

needed to rebalance the bridge after the high-amplitude "first" pulse which decreased the resistance. The other cycles each took 1-3 seconds. Execution of the RTCR measurements took approximately 50 ms (requiring primarily the time to heat the functional resistors, and make the measurement at the elevated temperature, since the room-temperature resistance was already known. The following data accompany the graphs in FIG. 19:

1st Cycle:
"first" pulse; 4.6V, 50 ms.
RTCR (after bridge rebalancing)=−52 arb units.
2nd Cycle:
"first" pulse: 3.0V, 100 ms.
RTCR (after bridge rebalancing)=−45 arb units.
3rd Cycle:
"first" pulse: 3.2V, 150 ms.
RTCR (after bridge rebalancing)=−32 arb units.
4th Cycle;
"first" pulse: 3.3V, 250 ms.
RTCR (after bridge rebalancing)=−12 arb units.
5th Cycle
"first" pulse: 3.2V, 100 ms.
RTCR (after bridge rebalancing)=1 arb unit.

Figure 6:
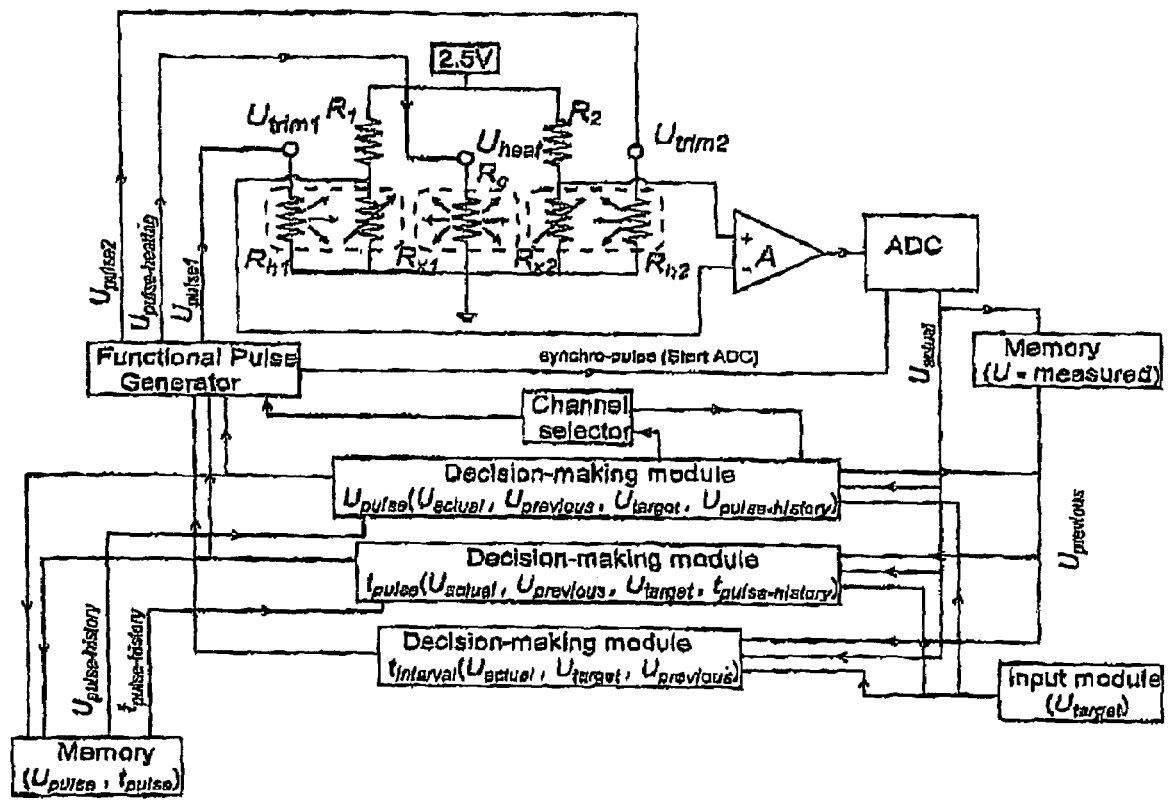
FIG. 6: Shows a schematic block diagram of the circuitry for bi-directional TCR adjustment.

The circuitry of the present invention includes a decision-making module. For the sake of simplicity of the present description, FIG. 6 illustrates three separate decision-making modules. It can be appreciated that these three modules in FIG. 6 are subsets of a general decision-making module that can perform the functions of all three of the modules described below.

Accordingly, the circuitry and decision-making modules, schematically described in FIG. 6, are for trimming of the resistor bridge structure can trim resistance and TCR of either of two resistors $R_{x1}$ or $R_{x2}$. The Functional Pulse Generator (function generator) has three output channels. Two of them supply heating pulses to the resistive heaters $R_{h1}$ and $R_{h2}$ for the purposes of trimming of the resistors $R_{x1}$ and $R_{x2}$. The third channel supplies heating pulses $U_{pulse\text{-}heating}$ to the additional resistive heater $R_c$.

A target of the circuitry is to balance the resistor bridge in order to tune the output voltage of the amplifier A to zero. It is also a target of the circuitry to adjust the difference in TCR (RTCR) of the two resistors so that changes in operating temperature do not unbalance the bridge (do not cause changes of output voltage of the amplifier A). To imitate rise of operational (ambient) temperature, electric power is dissipated in resistive heater $R_c$ located symmetrically between the two-functional resistors. The output voltage of the amplifier is measured before and during heating of th resistive heater $R_c$. Depending on the direction and value of shifts in output voltage the trimming of either resistor $R_{x1}$ or $R_{x2}$ is executed.

The output voltage is measured by the ADC and stored in memory.

The first decision-making module calculates the voltage pulse amplitude to be applied to the auxiliary heater $R_{h1}$ or $R_{h2}$ for the purposes of trimming of the bridge, it also decides which output channel, or combination of channels, of the Functional Pulse Generator should be activated for the next heating pulse. To heat two functional resistors $R_{x1}$ and $R_{x2}$ by the heater $R_c$, the decision-making module sends command to the channel selector to choose the appropriate channel and commands the functional pulse generator to produce heating pulse with a certain amplitude. The voltage pulse amplitude calculated by the first decision-making module may depend an the choice of the channel used for the previous heating pulse and is a function of the actual (last measured) output voltage $U_{actual}$, target voltage $U_{target}$ ($U_{target}=0$), voltage measured after previous trimming pulse $U_{previous}$ (stored in the memory), and voltage pulse amplitudes of previous pulses $U_{pulse\text{-}history}$: $U_{pulse}(U_{actual}, U_{target}, U_{previous}, U_{pulse\text{-}history})$.

The second decision-making module calculates pulse width as a function of $U_{actual}$, $U_{target}$, $U_{previous}$ and $t_{pulse\text{-}history}$: $t_{pulse}(U_{actual}, U_{target}, U_{previous}, t_{pulse\text{-}history})$.

The third decision-making module calculates the interval between pulses as a function of $U_{actual}$, $U_{target}$, $U_{previous}$: $t_{interval}(U_{actual}, U_{target}, U_{previous})$.

Pulse parameter $U_{pulse}$, $t_{pulse}$ and $t_{interval}$ and commands to activate one or more of the three output channels are sent to the Functional Pulse Generator, Parameters $U_{pulse}$ and $t_{pulse}$ are stored in memory to be used in the next pulse parameter calculations.

The Functional Pulse Generator also sends synchronizing pulses to the ADC to begin digitizing the analog voltage at the end of the time interval between trimming pulses (before next trimming pulse is applied).

While several examples in the above text show a methodical solution to trimming the TCR or RTCR, some less methodical procedures still succeed in adjusting the TCR or RTCR, albeit with less precision or less efficiency. For example, a procedure based on resistance excursions and restoration, without being particularly mindful of the "first" pulse amplitudes, also succeeds in trimming TCR in a longer time. Even a more random adaptive procedure would in many cases succeed in obtaining a moderately high precision adjustment of TCR.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

What is claimed is:

1. A method for trimming a temperature coefficient of resistance of at least one electrical component made from a thermally mutable material possessing a hysteresis characteristic with respect to a dependence of said temperature coefficient on said resistance, while maintaining a substantially constant resistance value, the method comprising applying a heating cycle to trim said resistance value away from a target resistance value and back to said target resistance value, wherein the temperature coefficient of resistance is modified after applying said heating cycle by cycling said resistance value away from and back towards a starting point, thereby using said hysteresis characteristic of said thermally mutable material.

2. The method as claimed in claim 1, wherein applying the heating cycle comprises using a first set of pulses to trim away from said target resistance value and pulses of amplitudes lower than said first set of pulses to trim back to said target resistance value.

3. The method as claimed in claim 2, wherein said heating cycle comprises at least one heating pulse having a first amplitude, followed by a plurality of heating pulses having amplitudes lower than said first amplitude.

4. The method as claimed in claim 3, wherein said plurality of heating pulses have varying amplitudes.

5. The method as claimed in claim 4, wherein each of said plurality of heating pulses has an amplitude equal to or lower than an amplitude of a previous pulse.

6. The method as claimed in claim 1, further comprising applying a second heating cycle to continue trimming said temperature coefficient of resistance.

7. The method as claimed in claim 6, wherein said second heating cycle comprises a first pulse of equal or greater amplitude than a first pulse of a previous heating cycle.

8. The method as claimed in claim 1, further comprising applying a plurality of subsequent heating cycles to further trim said temperature coefficient of resistance to a target temperature coefficient of resistance.

9. The method as claimed in claim 8, wherein said applying a plurality of subsequent heating cycles comprises trimming said temperature coefficient of resistance below said target temperature coefficient of resistance and gradually increasing said temperature coefficient of resistance to said target temperature coefficient of resistance.

10. The method as claimed in claim 1, wherein said electrical component is a resistor.

11. The method as claimed in claim 1, wherein said electrical component is on a thermally isolated micro-platform on a substrate.

12. The method as claimed in claim 11, wherein a resistive heating element is provided for generating said heating cycle.

13. The method as claimed in claim 12, wherein said heating element is on said thermally isolated micro-platform.

14. The method as claimed in claim 1, wherein said at least one electrical component is a pair of matched resistors, and said temperature coefficient of resistance is a relative temperature coefficient of resistance.

* * * * *